(12) United States Patent
Tokano et al.

(10) Patent No.: US 7,224,022 B2
(45) Date of Patent: May 29, 2007

(54) VERTICAL TYPE SEMICONDUCTOR DEVICE AND METHOD OF MANUFACTURING THE SAME

(75) Inventors: Keinichi Tokano, Kawasaki (JP); Yoshihiko Saito, Yokosuka (JP); Shigeo Kouzuki, Kawasaki (JP); Yasunori Usui, Yokohama (JP); Masaru Izumisawa, Kawasaki (JP); Takahiro Kawano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 10/804,018

(22) Filed: Mar. 19, 2004

(65) Prior Publication Data
US 2004/0238844 A1 Dec. 2, 2004

Related U.S. Application Data

(63) Continuation-in-part of application No. PCT/JP02/03216, filed on Mar. 29, 2002.

(30) Foreign Application Priority Data
Sep. 19, 2001 (JP) ............................. 2001-285472

(51) Int. Cl.
H01L 29/00 (2006.01)
(52) U.S. Cl. .................. 257/328; 257/329; 257/335; 257/341; 257/342
(58) Field of Classification Search ................ 257/341, 257/342
See application file for complete search history.

(56) References Cited

U.S. PATENT DOCUMENTS

| 4,754,310 | A | 6/1988 | Coe |
| 5,438,215 | A | 8/1995 | Tihanyi |
| 5,751,024 | A | 5/1998 | Takahashi |
| 6,040,600 | A | 3/2000 | Uenishi et al. |
| 6,337,499 | B1 * | 1/2002 | Werner ........................ 257/329 |
| 6,410,958 | B1 | 6/2002 | Usui et al. |
| 6,674,126 | B2 * | 1/2004 | Iwamoto et al. ............. 257/341 |
| 6,878,989 | B2 * | 4/2005 | Izumisawa et al. ......... 257/328 |
| 2001/0028083 | A1 * | 10/2001 | Onishi et al. ................ 257/328 |
| 2003/0132450 | A1 * | 7/2003 | Minato et al. .............. 257/110 |

(Continued)

FOREIGN PATENT DOCUMENTS

CN 1258933 A 7/2000

(Continued)

OTHER PUBLICATIONS

U.S. Appl. No. 10/844,323, filed May 13, 2004, Sato et al.

(Continued)

*Primary Examiner*—Hoai Pham
*Assistant Examiner*—Abul Kalam
(74) *Attorney, Agent, or Firm*—Oblon, Spivak, McClelland, Maier & Neustadt, P.C.

(57) ABSTRACT

As and B are implanted to side surfaces of trenches 3 by a rotation ion implanting method, and by using a difference between these impurities in diffusion coefficient, the structure in which an n⁻-type epitaxial Si layer is interposed between trenches 3 is converted into a semiconductor structure consisting of n-type pillar layer 5/p-type pillar layer 4/n-type pillar layer 5 lining up. The structure can function substantially the same role as that of a super junction structure.

15 Claims, 15 Drawing Sheets

U.S. PATENT DOCUMENTS

2003/0222297 A1* 12/2003 Krumrey et al. ............ 257/302
2003/0222327 A1* 12/2003 Yamaguchi et al. ........ 257/500

FOREIGN PATENT DOCUMENTS

| | | |
|---|---|---|
| DE | 197 48 523 A1 | 5/1999 |
| EP | 0 587 176 A2 | 3/1994 |
| EP | 0 665 595 A1 | 2/1995 |
| EP | 0 732 749 A2 | 9/1996 |
| JP | 7-7154 | 1/1995 |
| JP | 7-176692 | 7/1995 |
| JP | 8-64690 | 3/1996 |
| JP | 8-222735 | 8/1996 |
| JP | 9-266311 | 10/1997 |
| JP | 10-284591 | 10/1998 |
| JP | 11-233759 | 8/1999 |
| JP | 2000-504879 | 4/2000 |
| JP | 2000-183348 | 6/2000 |
| JP | 2000-208527 | 7/2000 |
| JP | 2000-260982 | 9/2000 |
| JP | 2000-323706 | 11/2000 |
| JP | 2001-111050 | 4/2001 |
| JP | 2001-298191 | 10/2001 |
| WO | WO 01/03202 A1 | 1/2001 |

OTHER PUBLICATIONS

U.S. Appl. No. 11/194,609, filed Aug. 2, 2005, Yamashita et al.
U.S. Appl. No. 11/265,208, filed Nov. 3, 2005, Okumura et al.
U.S. Appl. No. 10/983,658, filed Nov. 9, 2004, Tokano et al.

* cited by examiner

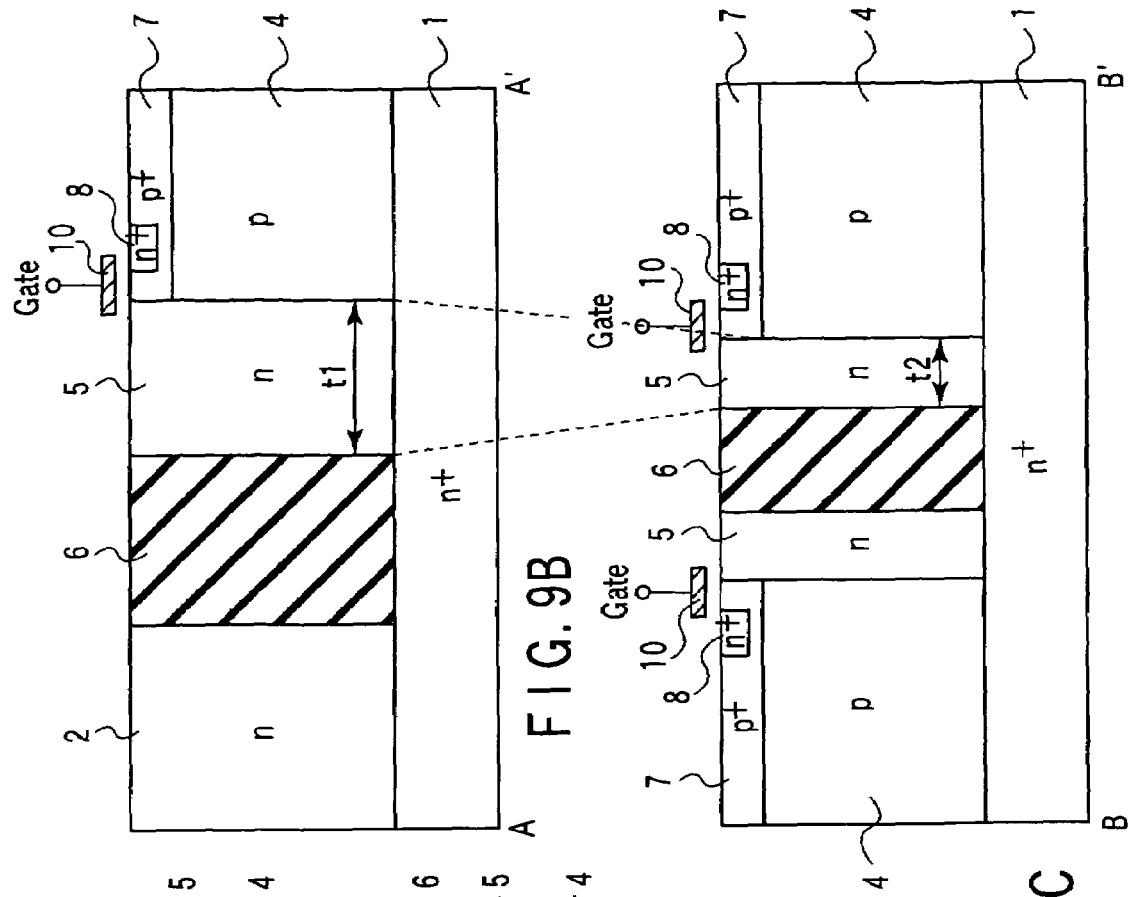
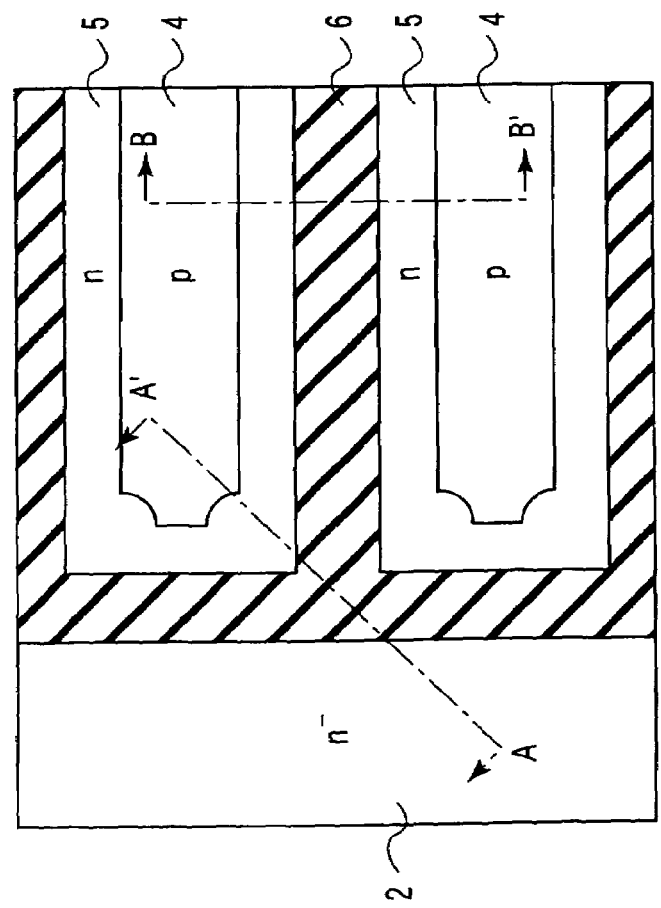
FIG. 9A
FIG. 9B
FIG. 9C

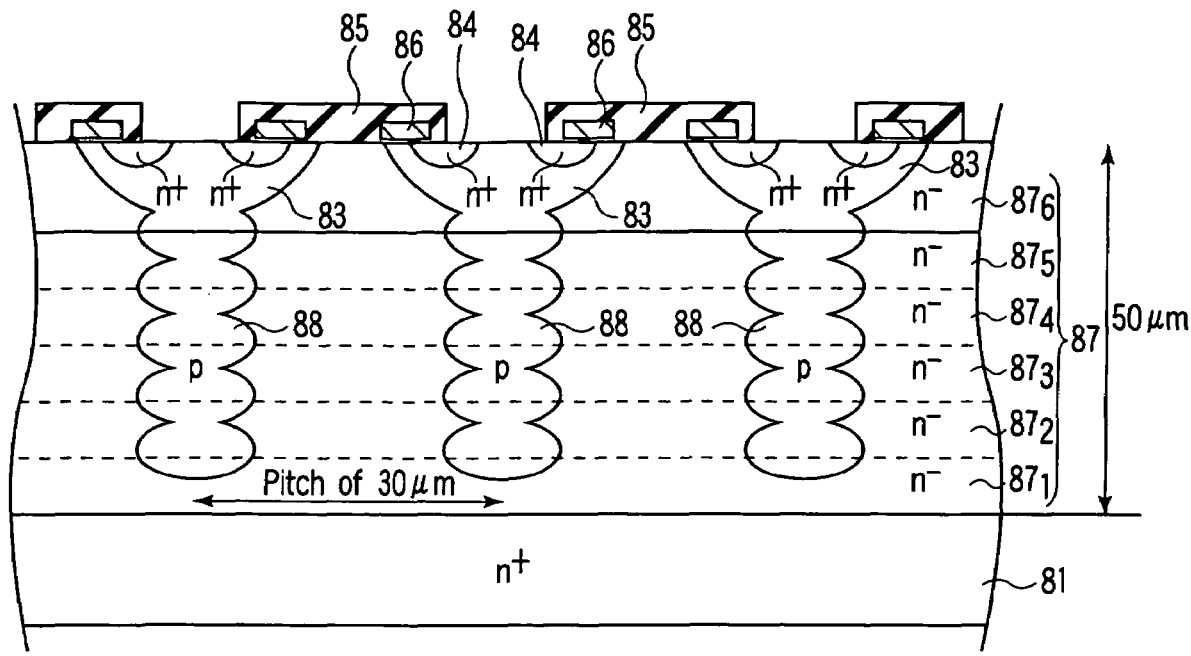
F I G. 22
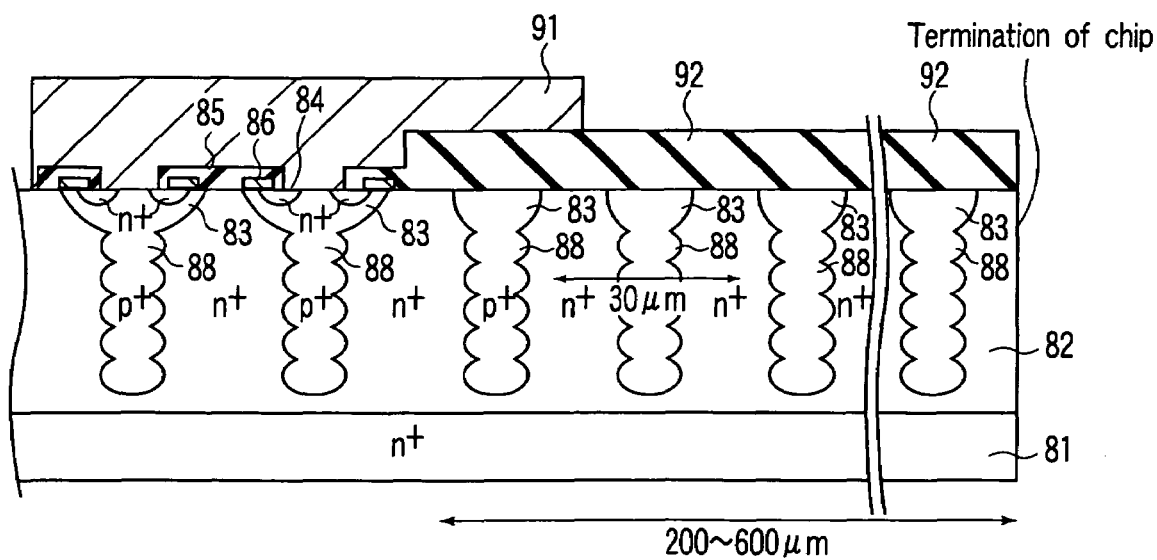
F I G. 24

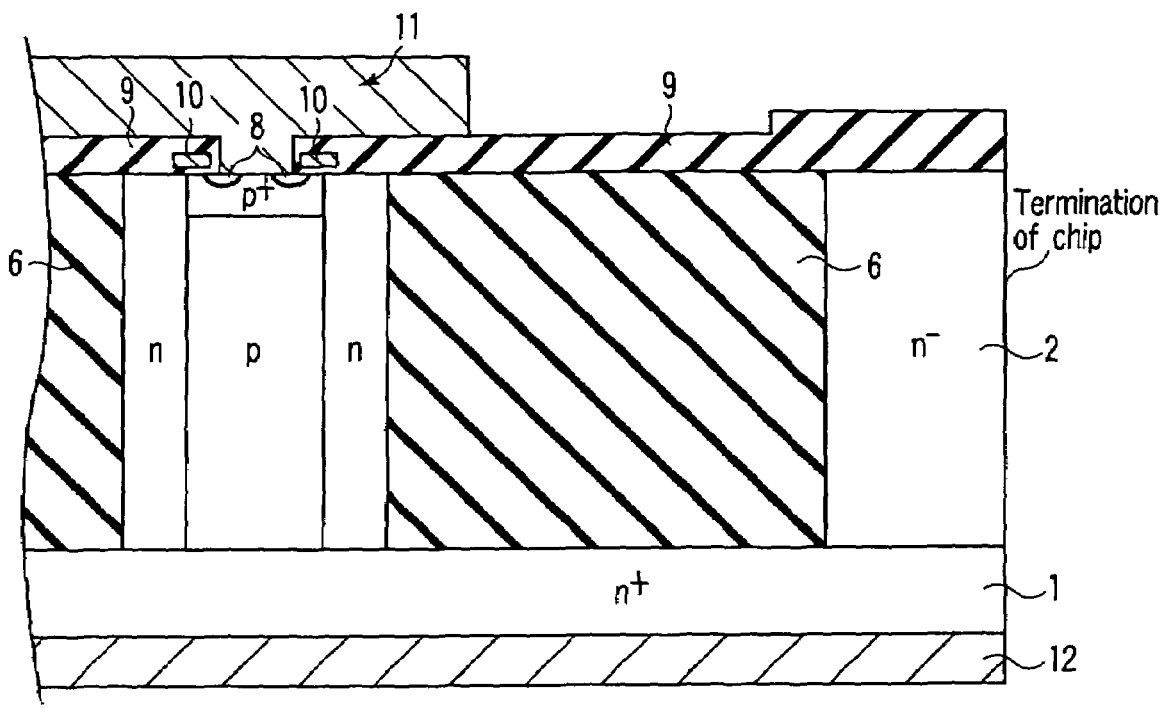
F I G. 25
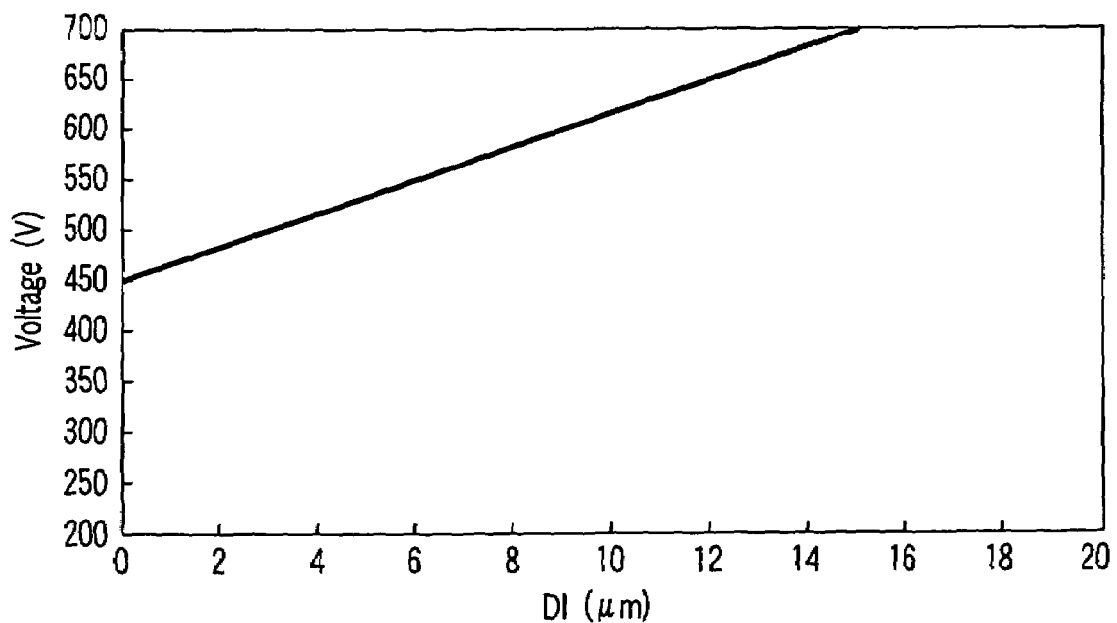
F I G. 26

US 7,224,022 B2

VERTICAL TYPE SEMICONDUCTOR DEVICE AND METHOD OF MANUFACTURING THE SAME

CROSS-REFERENCE TO RELATED APPLICATIONS

This is a Continuation-in-Part Application of PCT Application No. PCT/JP02/03216, filed Mar. 29, 2002, which was not published under PCT Article 21(2) in English.

This application is based upon and claims the benefit of priority from prior Japanese Patent Application No. 2001-285472, filed Sep. 19, 2001, the entire contents of which are incorporated herein by reference.

BACKGROUND OF THE INVENTION

1. Field of the Invention

The present invention relates to a semiconductor device and a method of manufacturing the semiconductor device, and more specifically, to an improvement of a semiconductor device comprising a power MOSFET and a method of manufacturing such a device.

2. Description of the Related Art

FIG. 21 is a diagram showing a cross section of a typical conventional power MOSFET. In this figure, reference numeral 81 denotes an $n^+$-type Si substrate having a high impurity concentration, which serves as an $n^+$-type drain layer. An $n^-$-type epitaxial Si layer 82 having a low impurity concentration is formed on the $n^+$-type Si substrate 81.

A p-type base layer 83 is formed selectively on a surface of the $n^-$-type epitaxial Si layer 82, and further an $n^+$-type source diffusion layer 84 having a high impurity concentration is formed selectively on a surface of the p-type base layer 83.

A gate electrode 86 is provided via a gate insulating film 85 on the p-type base layer 83 interposed between the $n^+$-type source diffusion layer 84 and the $n^+$-type epitaxial Si layer 82.

In a power MOSFET of the above-described type, that is, a planar type power MOSFET, a current path to the MOS device is taken from a rear surface of the $n^+$-type Si layer 81 via the $n^-$-type epitaxial Si layer 82. With this structure, the resistance during the device is on (ON resistance) depends on the thickness of the $n^-$-type epitaxial Si layer 82.

Meanwhile, a depletion layer extends within the $n^-$-type epitaxial Si layer 82, and therefore the maintenance of the withstand voltage is determined by the thickness of the epitaxial layer. Typical values of the ON resistance and withstand voltage are 1.52 (Ω) and 746 (V), respectively.

As described above, in the conventional power MOSFET shown in FIG. 21, the current path and the region where the withstand voltage is maintained are located at the same place. With this structure, if the thickness of the epitaxial layer is increased to raise the withstand voltage, the ON resistance is increased as well. On the other hand, if the thickness of the epitaxial layer is decreased to lower the ON resistance, the withstand voltage is decreased as well. Thus, there is a conflicting relationship between these points, and it had been difficult to satisfy these points at the same time.

Especially, in the case where a drain-source reverse directional withstand voltage should be maintained at 200V or higher, the resistance of the $n^-$-type epitaxial Si layer 82 needs to be increased. However, if the resistance $R_{Epi}$ of the $n^-$-type epitaxial Si layer 82 is increased, the lowering of the ON resistance is inevitably limited with the conventional structure. Note that the terms, resistance $R_{ch}$ and resistance $R_{JFET}$ indicate the channel resistance and junction FET resistance, respectively.

However, recently, a power MOSFET with a new structure called super junction structure, which can satisfy the above-described points at the same, has been proposed. FIG. 22 shows a cross section of a power MOSFET with the new structure. Note that the sections of this figure that correspond to those shown in FIG. 21 are designated by the same reference numerals and the detailed descriptions therefor will be omitted.

This power MOSFET is of a planar type; however, it has the following structure. That is, n-type epitaxial Si layers 87 ($87_1$ to $87_6$) that have an impurity concentration higher than that of the $n^-$-type epitaxial Si layer 82 are located at the center of the MOS, and p-type pillar layers 88 are located on both sides thereof. The p-type pillar layers 88 are formed to communicate to the p-type base layers 83, respectively. According to this structure, the current path and the region where the withstand voltage is maintained are separated from each other.

With this structure, the main current flows through the n-type epitaxial Si layer 87, and therefore the ON resistance depends on the impurity concentration of the n-type epitaxial Si layer 87. On the other hand, the maintenance of the withstand voltage, since the depletion layer is extended in a lateral direction, is determined by the impurity concentration and width of each of the n-type epitaxial Si layer 87 and the p-type pillar layers 88. Thus, it is possible to satisfy both of the decrease in the ON resistance and the increase in the withstand voltage. Note that in the case of, for example, the 600V class, the ON resistance can be decreased to ⅓ or less of that of the planar type element shown in FIG. 21.

However, the power MOSFET with the conventional super junction structure entails the following drawbacks.

That is, in order to form the new structure shown in FIG. 22, a series of steps that include growing a thin n-type epitaxial Si layer 82, ion implantation of arsenic (As) as an n-type impurity, forming of a mask 90 for implantation of a p-type impurity, and ion implantation of boron (B) as a p-type impurity, must be repeated.

Specifically, in the case of a 600V-class element, the thickness of the n-type epitaxial Si layer 87 is about 50 µm whereas the thickness of the n-type epitaxial Si layer 82 is about 8.3 µm. Therefore, the above-described series of steps must be repeated 5 or 6 times.

In this case, 5 or 6 times of the epitaxial growth step, 10 or 12 times of the mask formation step and 10 or 12 times of the ion implantation step are required. After that, annealing is carried out to activate the n-type and p-type impurities that have been ion-implanted, and thus the n-type epitaxial Si layer 87 and the p-type pillar layers 88 are completed.

As described above, the manufacture of the power MOSFET having the conventional super junction structure requires a significantly greater number of processing steps as compared to the case of the planar type power MOSFET. Thus, the production cost is increased. More specifically, the production cost for the chip of the conventional power MOSFET would be almost the same as that of the planar-type large-area chip (of a low ON resistance type).

Further, in order to form a p-type pillar layer 88 such as to connect the p-type layers located above and below (, which are layers formed by ion implantation of B shown in FIG. 23D), it is necessary that B ions that are implanted should be diffused in a vertical direction (thickness direction) by at least the thickness of the $n^-$-type epitaxial Si layer 82.

During this process, B ions diffuse in a lateral direction. Therefore, there is a drawback in which the reduction in measurement of the element in the lateral direction of the unit cell (measurement in its channel length direction) is hindered by the diffusion of B in the lateral direction.

Specifically, in the case of an element of the 600V class, the thickness of the n-type epitaxial Si layer 87 is about 5 to 8 μm. Therefore, taking the diffusion in the lateral direction into consideration, the width of the unit cell of the element would be about 30 μm.

FIG. 24 shows a termination structure used in the power MOSFET having the conventional super junction structure. In this figure, reference numeral 91 denotes the source electrode and numeral 92 denotes an insulating film.

The termination structure is formed of repetitions of the n-type epitaxial Si layer 87 and the p-type pillar layers 88. In order to relax the electrical field within the n⁻-type epitaxial Si layer 82, it is necessary to increase the potential gradually from the source to drain.

Specifically, in the case of an element of the 600V class and the width of a unit cell is about 30 μm, 10 to 20 unit cells are required in terms of the unit number. Therefore, a termination structure having a length of 300 μm to 600 μm is required. Such a long termination structure hinders the reduction in measurements of the entire device.

As described above, the power MOSFET with the conventional super junction structure is different from the planar type power MOSFET in that the lowering of the ON resistance and the increase in the withstand voltage can be achieved at the same time. However, the power MOSFET with the conventional super junction structure entails the problem of involving a far greater number of processing steps in the manufacture thereof as compared to that of the planar type power MOSFET.

BRIEF SUMMARY OF THE INVENTION

According to an aspect of the invention, there is provided a semiconductor device comprising: a first conductivity type semiconductor substrate; a vertical unit cell that employs the first conductivity type semiconductor substrate as a first conductivity type drain layer; and a separating member formed on the first conductivity type semiconductor substrate, separating the unit cell from other element, the unit cell comprising: a semiconductor structure comprising three semiconductor layers selectively formed on a main surface of the first conductivity type semiconductor substrate, the three semiconductor layers including a second conductivity type semiconductor layer and two first conductivity type semiconductor layers formed to interpose the second conductivity type semiconductor layer from both side surfaces, a pn junction boundary between the second conductivity type semiconductor layer and the first conductivity type semiconductor layer being substantially vertical to the main surface of the first conductivity type semiconductor substrate, a second conductivity type base layer formed on an upper surface of the second conductivity type semiconductor layer and having an impurity concentration higher than the second conductivity type semiconductor layer; a first conductivity type source diffusion layer selectively formed on a surface of the second conductivity type base layer; a gate insulating film formed on the second conductivity type base layer interposed between the first conductivity type source diffusion layer and the first conductivity type semiconductor layer, and a gate electrode formed on the gate insulating film.

According to an aspect of the invention, there is provided a method of manufacturing a semiconductor device comprising: growing a first conductivity type epitaxial semiconductor layer having a low impurity concentration on a first conductivity type semiconductor substrate having a high impurity concentration; making a plurality of trenches in the first conductivity type epitaxial semiconductor layer so as to reach the first conductivity type semiconductor substrate; implanting a first conductivity type impurity and a second conductivity impurity having a diffusion coefficient larger than the first conductivity type impurity to side surfaces of the trenches by an ion implantation method, thereby converting the first conductivity type epitaxial semiconductor layer in a region interposed between the trenches into a semiconductor structure comprising a second conductivity type semiconductor layer and two first conductivity type semiconductor layers formed to sandwich the second conductivity type semiconductor layer from both side surfaces by using a difference between the impurities in diffusion coefficient, a pn junction boundary between the second conductivity type semiconductor layer and the first conductivity type semiconductor layer being substantially vertical to the main surface of the first conductivity type semiconductor substrate; forming a first insulating film on at least a bottom surface and side surfaces of the trenches; forming a second conductivity type base layer having an impurity concentration higher than the second conductivity type semiconductor layer on an upper surface of the second conductivity type semiconductor layer; selectively forming a first conductivity type source diffusion layer on a surface of the second conductivity type base layer; and forming a gate insulating film and a gate electrode on the second conductivity type base layer interposed between the first conductivity type source diffusion layer and the first conductivity type semiconductor layer.

BRIEF DESCRIPTION OF THE SEVERAL VIEWS OF THE DRAWING

FIGS. 9A to 9C each are a diagram illustrating the problem that occurs when the planar pattern of the npn pillar structure of the DTMOS unit cell according to the first embodiment of the present invention is in stripes;

FIG. 22 is a cross sectional view illustrating another power MOSFET;

FIG. 24 is a diagram showing a conventional termination structure;

FIG. 25 is a diagram showing a termination structure of another version of the DTMOS unit cell according to the first embodiment of the present invention; and FIG. 26 is a diagram illustrating the relationship between the distance D1 (source electrode projecting amount) and the withstand voltage.

DETAILED DESCRIPTION OF THE INVENTION

Embodiments of the present invention will now be described in detail with reference to accompanying drawings.

First Embodiment

FIGS. 1 to 7 are cross sectional views illustrating steps in the method of manufacturing a power MOSFET according to the first embodiment of the present invention. This embodiment will be described in connection with a vertical power MOSFET (DTMOS: Deep Trench MOSFET) unit cell having a novel withstand voltage structure that can assure a medium high withstand voltage of 200V or higher.

Figure 1:
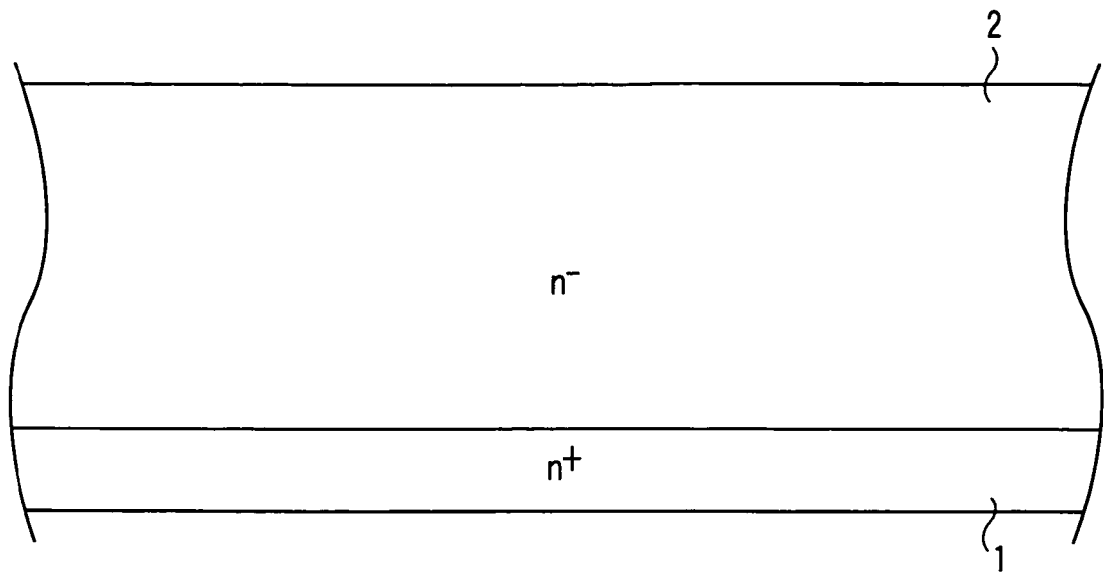
FIG. 1 is a cross sectional view illustrating a step in a method of manufacturing a power MOSFET (DTMOS unit cell) according to the first embodiment of the present invention.

First, as shown in FIG. 1, an n$^-$-type epitaxial Si layer 2 having a low impurity concentration (high resistance) is formed on an n$^+$-type Si substrate 1 having a high impurity concentration, which serves as an n$^+$-type drain layer.

The impurity concentration of the n$^+$-type Si substrate 1 is, for example, $1 \times 10^{19}$ (atoms/cm$^3$) or higher, and the resistivity thereof is, for example, 0.006 (Ω·cm) or lower. The thickness of the n$^-$-type epitaxial Si layer 2 is, for example, 50 μm.

Figure 2A:
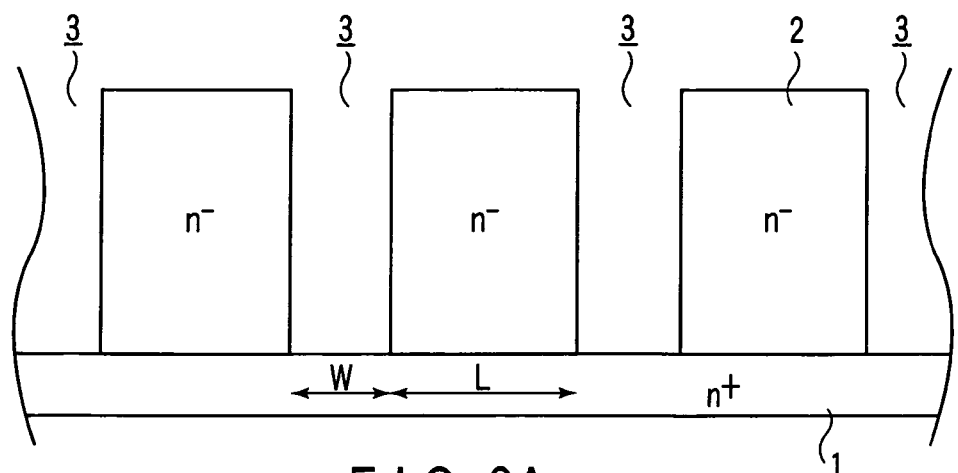
FIGS. 2A and 2B each are a cross sectional view illustrating a step in the manufacturing method, that follows the one shown in FIG. 1.

Next, as shown in FIG. 2A, deep trenches 3 are made in the n$^-$-type epitaxial Si layer 2 by means of photolithography and RIE (Reactive Ion Etching), such as to have a depth that each trench reaches the n$^+$-type Si substrate 1.

The depth of the trench 3 is, for example, about 51 to 55 μm, the width W of the trenches 3 is, for example, about 8 μm, and the interval L between trenches 3 is, for example, about 15 μm. In order to obtain a withstand voltage of a 600V class, the depth of each trench 3 should be, for example, about 50 μm or more. It should be noted here that the trenches 3 each have a shape with a uniform width in the figure; however when the RIE is employed, an actually formed trench would have a tapered shape. That is, it would be such a shape that it is approximately vertical to the surface of the substrate.

Figure 2B:
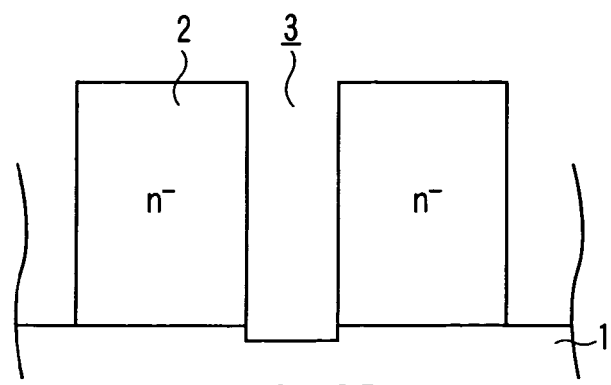

Further, in practice, each trench 3 is formed by over-etching so that it surely reaches n$^+$-type Si substrate 1. As a result, the level of the bottom of each trench 3 is lower than the level of the surface of the n$^+$-type Si substrate 1 which is underneath the n$^-$-type epitaxial Si layer 2, as shown in FIG. 2B.

Figure 3:
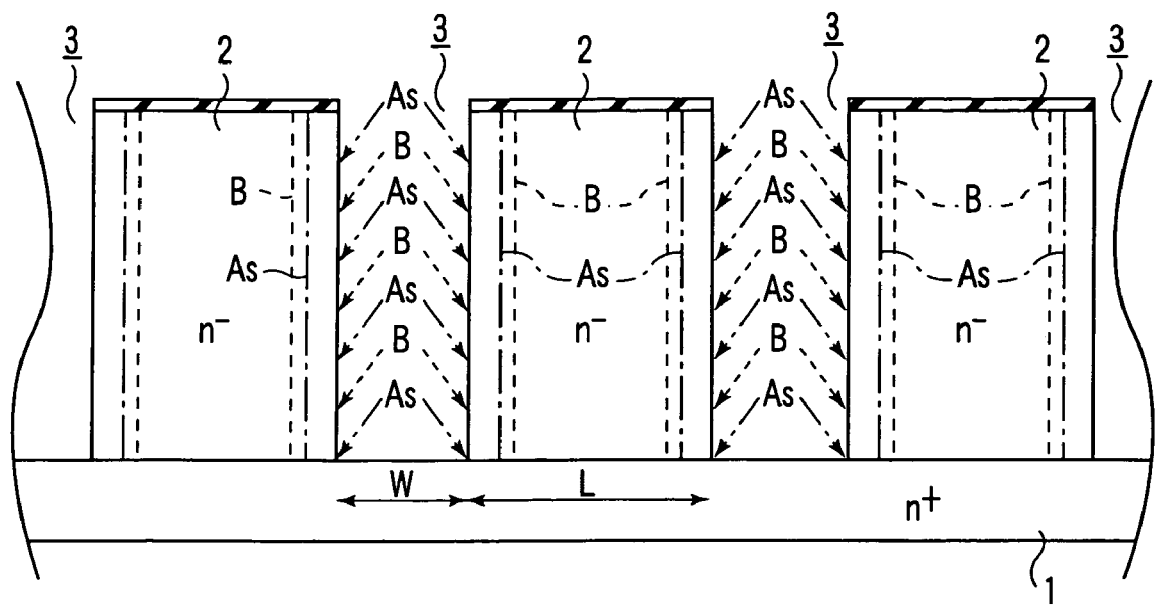
FIG. 3 is a cross sectional view illustrating a step in the manufacturing method, that follows the one shown in FIG. 2B.

Next, as shown in FIG. 3, As and B are implanted into side walls of each trench 3 at an implantation angle of 5° to 7° by a rotation ion implantation method.

After that, annealing is carried out at 1150° C. for 24 hours, and thus As and B are diffused out at the same time from both side of the n$^-$-type epitaxial Si layer 2 having a mesa structure, which is interposed between trenches 3.

Here, the diffusion coefficient of As at 1150° C. is $9 \times 10^{-3}$ μm$^2$/h, whereas the diffusion coefficient of B is about $5.5 \times 10^{-2}$ μm$^2$/h. Thus, the diffusion coefficient of B is larger by an order of magnitude. With these coefficients, As diffuses about 2.5 μm, whereas B diffuses about 7.5 μm.

Figure 4:
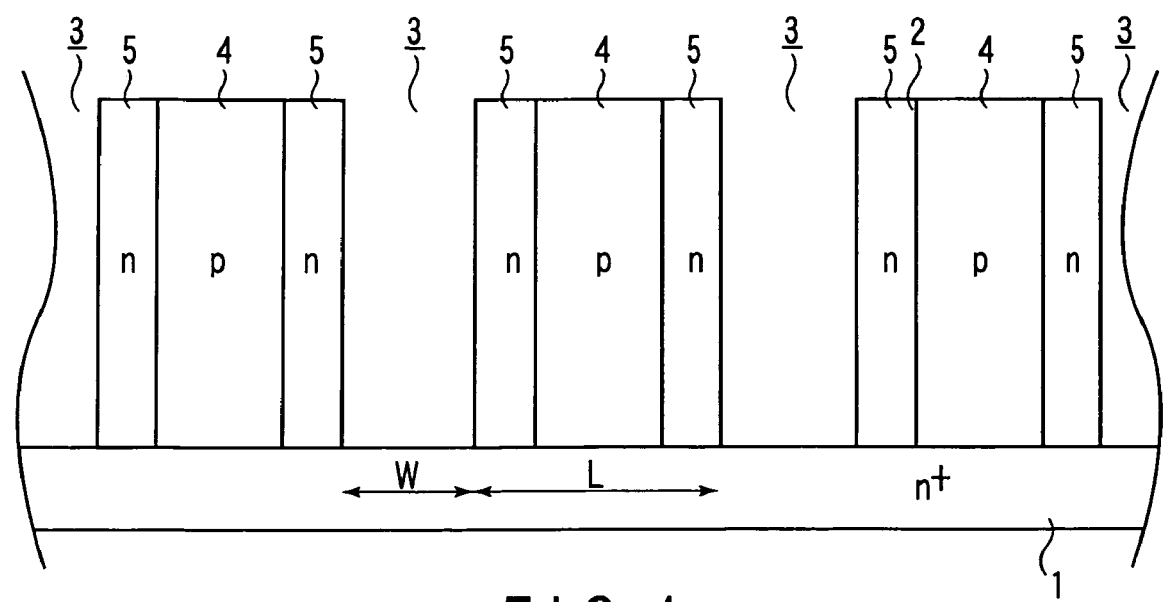
FIG. 4 is a cross sectional view illustrating a step in the manufacturing method, that follows the one shown in FIG. 3.

As a result, as shown in FIG. 4, through the annealing mentioned above, B diffusing from a left-hand side and B diffusing from a right-hand side are mixed together at a central portion of the n$^-$-type epitaxial Si layer 2 having a mesa structure, which is interposed between trenches 3, and thus a rectangular p-type pillar layer 4 is formed. At the same time, on the right and left sides of the layer, a rectangular n-type pillar layer 5 is formed in a self-alignment manner.

The measurement of the p-type pillar layer 4 taken in the lateral direction is about 10 μm, and the measurement of the n-type pillar layer 5 taken in the lateral direction in each side is about 2.5 μm. Therefore, the width of the unit cell is about 15 μm, which is about a half of that of the conventional case. In this manner, the measurements of the element can be easily reduced.

In this embodiment, the npn pillar structure is formed by diffusing B and As actively in the lateral direction, and therefore the diffusion of B in the lateral direction does not hinder the reduction of the size of the element unlike the case of the conventional super junction structure.

The semiconductor structure that is made of the n-type pillar layer 5/the p-type pillar layer 4/the n-type pillar layer 5, which line up in the lateral direction, that is, the new withstand voltage structure (npn pillar structure) according to the first embodiment of the present invention, serves substantially the same functions as that of the conventional super junction structure. Therefore, the reduction of the ON resistance (⅓ or less of that of the planar type element shown in FIG. 21) and the increase in the withstand voltage can be achieved at the same time.

Further, the above-described structure can be realized merely by ion-implantation of As and B to the side surfaces of the pillar layer. Where the total amount of B in the p-type pillar layer 4 is represented by $N_B$, and the total amount of As in the n-type pillar layers 5 that sandwiches the p-type pillar layer 4 from both sides is represented by $N_{As}$, a relationship: $100 \times |N_B - N_{As}|/N_B \leq 5$ can be satisfied.

The control of the amount of the impurity at a high accuracy can be achieved by merely ion implantation of As and B into the side walls of each trench. Thus, the dispersion in the impurity concentrations in the p-type pillar layer 4 and n-type pillar layers 5 can be sufficiently inhibited. Consequently, the increase in the dispersion in element characteristics can be suppressed.

In the figure, the pn junction surface between the n-type pillar layer 5 and the p-type pillar layer 4 is illustrated to be vertical to the surface of the n$^+$-type Si substrate 1. However, in practice, since each trench 3 is formed by the RIE process, the pn junction surface is displayed from the vertical position by a portion corresponding to the inclination of the side wall of the trench 3. That is, the pn junction surface between the n-type pillar layer 5 and the p-type pillar layer 4 is approximately vertical to the surface of the substrate 1.

Figure 5:
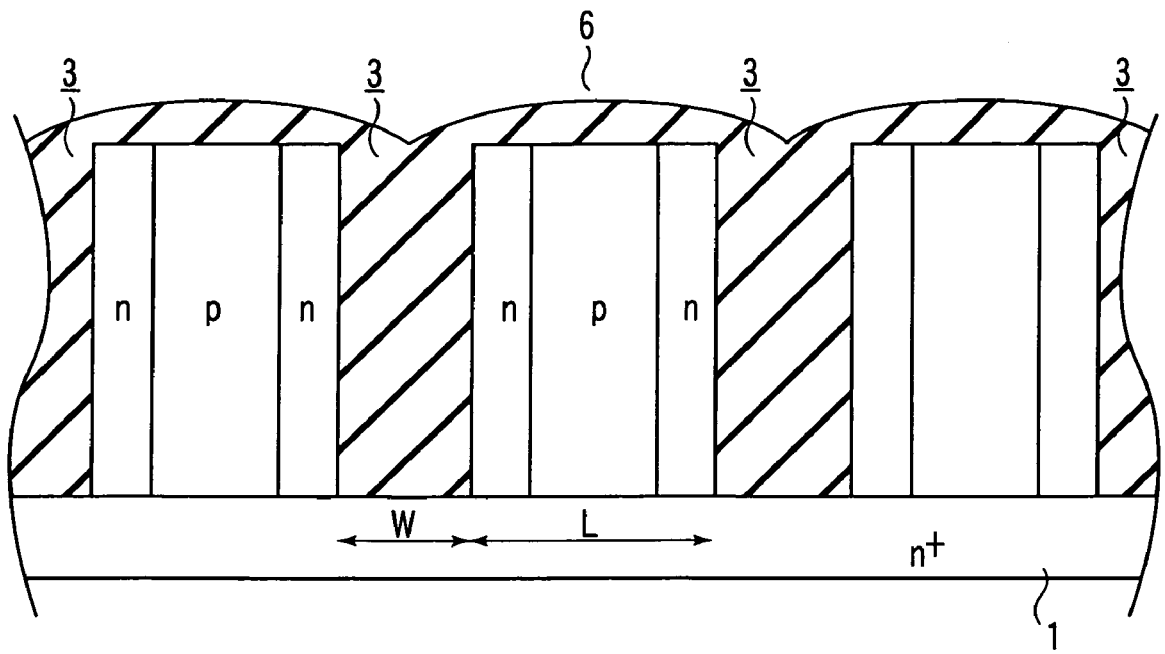
FIG. 5 is a cross sectional view illustrating a step in the manufacturing method, that follows the one shown in FIG. 4.

Next, as shown in FIG. 5, an insulating film 6 is formed on the entire surface such that the film is embedded in the trenches 3. The insulating film 6 is formed by the following manner. That is, for example, an SiO$_2$ film is formed on the side surfaces of each trench 3 by thermal oxidation, and after that an SiO$_2$ film or SiN film is deposited on the entire surface by CVD (Chemical Vapor Deposition). In this manner, such a structure that the npn pillar structure is surrounded by the insulating film 6 can be formed.

Figure 6:
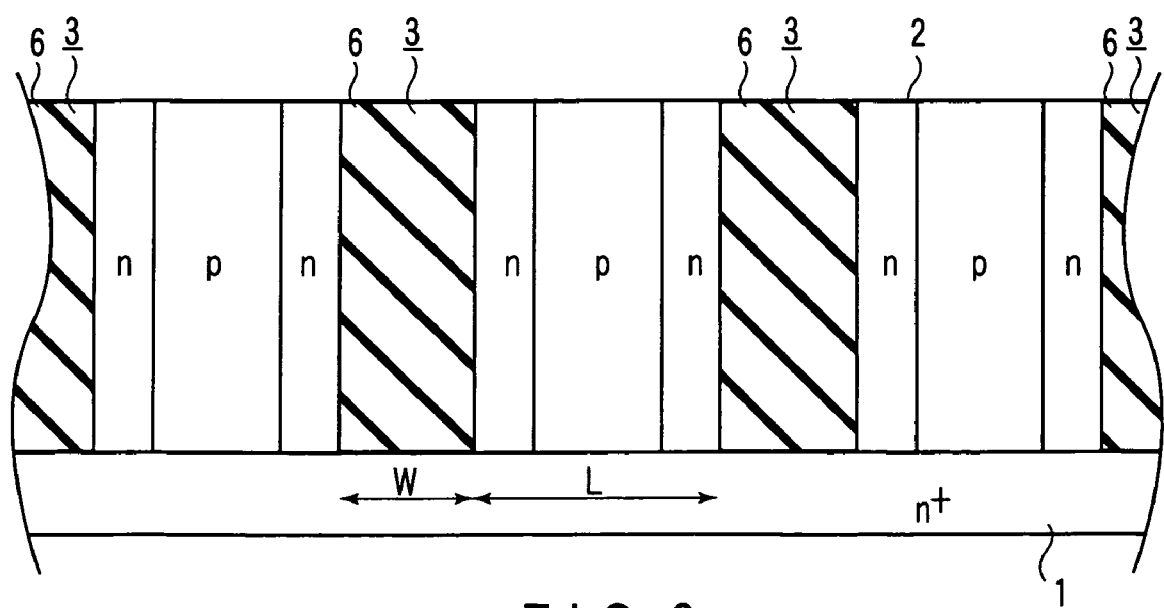
FIG. 6 is a cross sectional view illustrating a step in the manufacturing method, that follows the one shown in FIG. 5.

Next, as shown in FIG. 6, the surface is planarized by CMP (Chemical Mechanical Polishing) and the unnecessary portions of the insulating film 6, that are outside the trenches 3 are removed, thereby carrying out separation of element (Deep Trench Isolation). It should be noted here that etching may be employed in place of CMP. As shown in FIG. 2B, when over-etching is carried out, the level of the bottom surface of the insulating film 6 will be lower than the level of the surface of the n$^+$-type Si substrate 1 located underneath the npn pillar structure.

Figure 7:
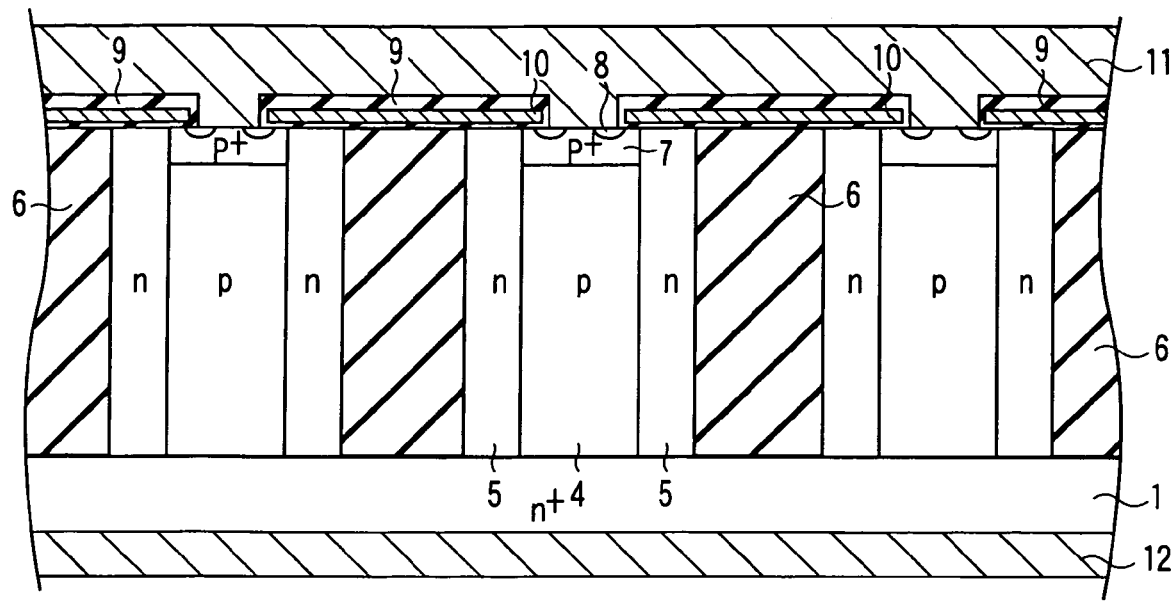
FIG. 7 is a cross sectional view illustrating a step in the manufacturing method, that follows the one shown in FIG. 6.

The following processing step from the above-described one is the same as that of the conventional planar type power MOSFET. Specifically, as shown in FIG. 7, the manufacturing process proceeds in the following order: the step of forming a p$^+$-type base layer 7 on the surface of the p-type pillar layer 4, the step of forming a n$^+$-type source diffusion layer 8 selectively on the surface of the p-type base layer 7, the step of forming a gate insulating film 9 and gate electrode 10 on the p$^+$-type base layer 7 interposed between the n$^+$-type source diffusion layer 8 and the n-type pillar layer 5, and the step of forming the source electrode 11 and drain electrode 12. It should be noted that FIG. 7 illustrates three unit cells. In this figure, the interlayer insulating film that covers the gate electrode 10 and has contact holes made for the source electrode 11 and the like, is denoted by the same reference numeral, that is 9, as that for the gate insulating film.

Figure 8:
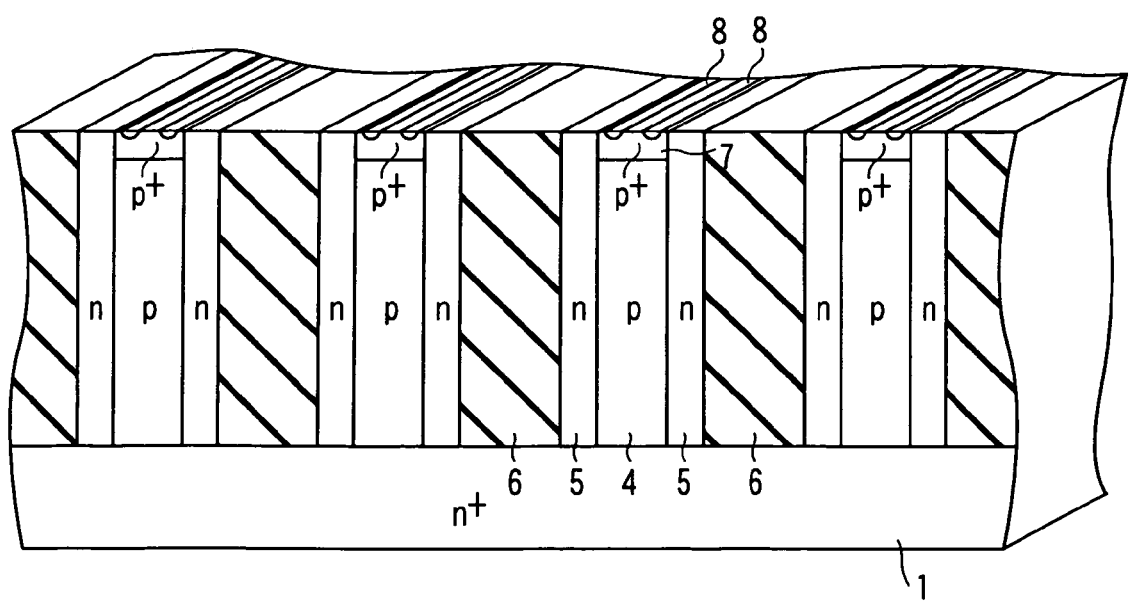
FIG. 8 is a perspective and cross sectional view illustrating a stage where the process has reached up to the formation of the n⁺-type source diffusion layer.

FIG. 8 is a perspective and cross sectional view illustrating a stage where the process has reached up to the formation of the n$^+$-type source diffusion layer 8. The pattern obtained by observing the npn pillar structure from above is in stripes as shown in the figure. The gate electrode 10 is, for example, a polysilicon gate, a polycide gate or a metal gate.

According to the structure described above, the semiconductor structure comprising three semiconductor layers serves substantially the same as that of the super junction structure, therefore the reduction of the ON resistance and the increase in the withstand voltage can be achieved at the same time.

Further, according to the above-described structure, the above-mentioned manufacturing method of a semiconductor device allows to manufacture the device without significant increase in the number of processing steps. That is, each one step of implantation of a first conductive type and second conductive type impurities into a first conductive type epitaxial layer can convert a distribution of the conductive type of the first conductive type epitaxial layer into the one required to form a semiconductor structure that serves substantially the same as that of the super junction structure.

Figure 21:
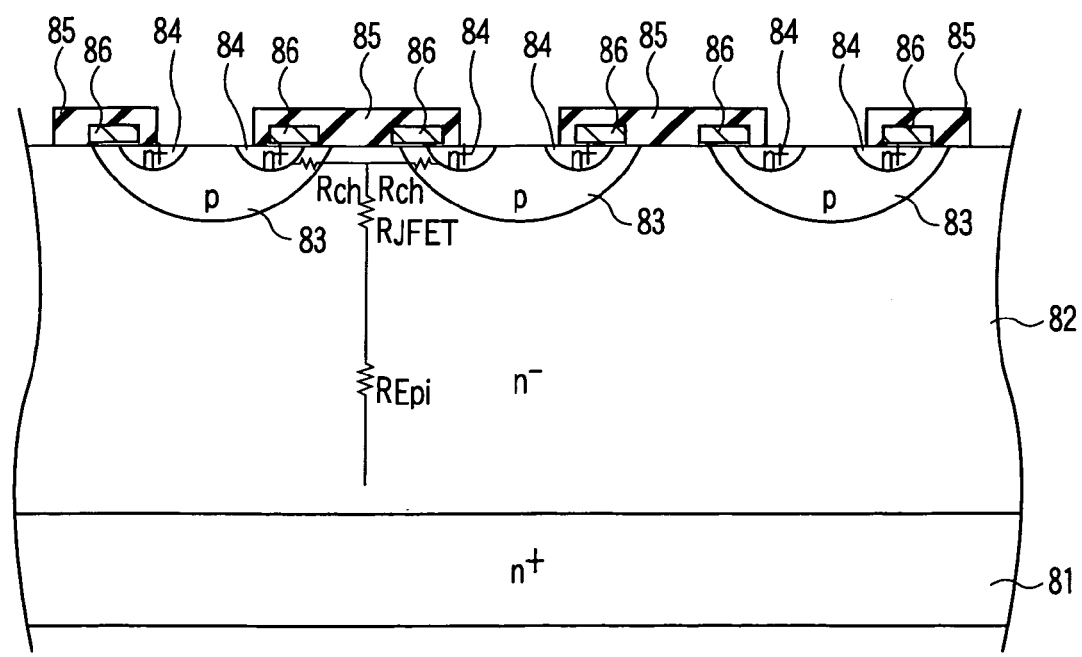
FIG. 21 is a cross sectional view illustrating a conventional power MOSFET.
Figure 23A:
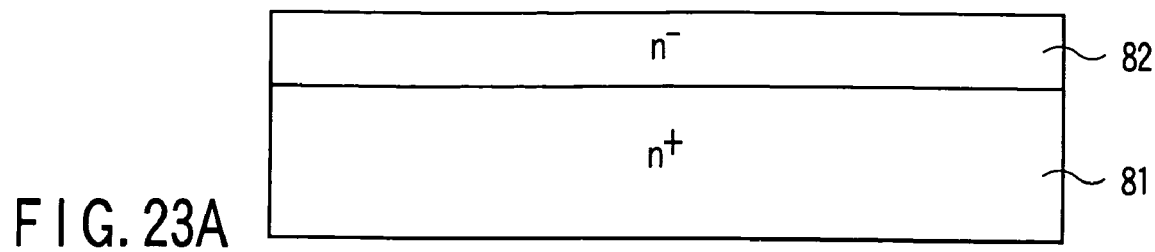
FIGS. 23A to 23D each are a cross sectional view illustrating a step in the method of manufacturing the power MOSFET shown in FIG. 22.
Figure 23B:
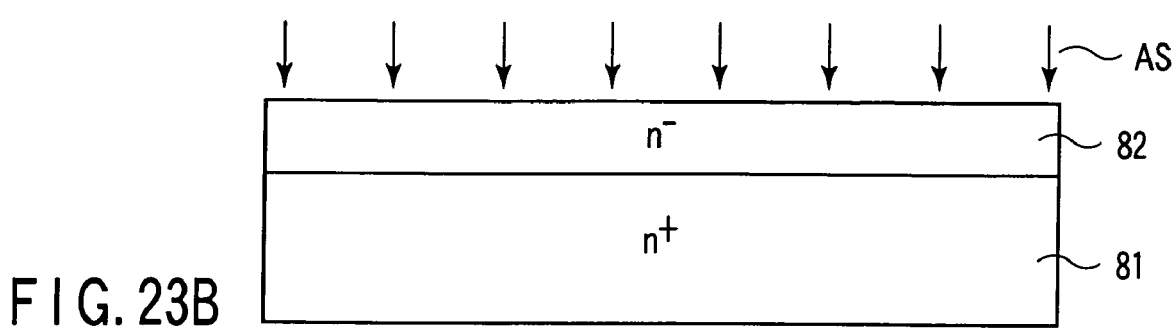
Figure 23C:
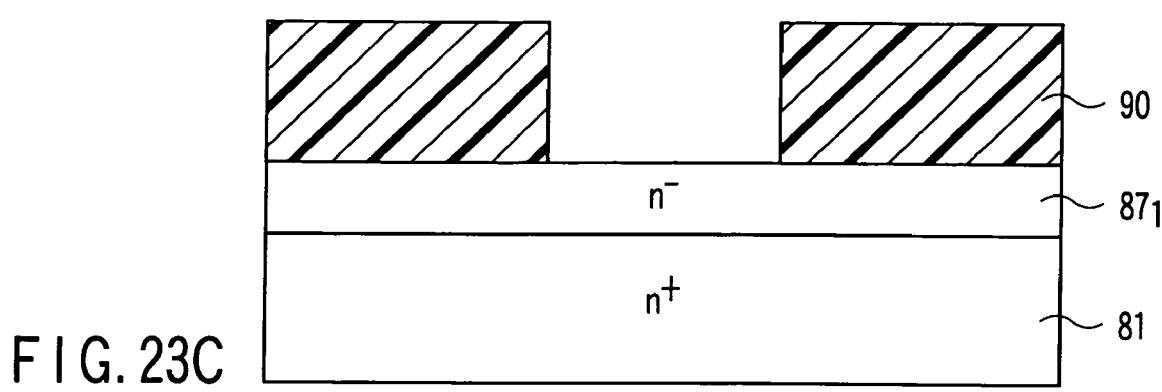
Figure 23D:
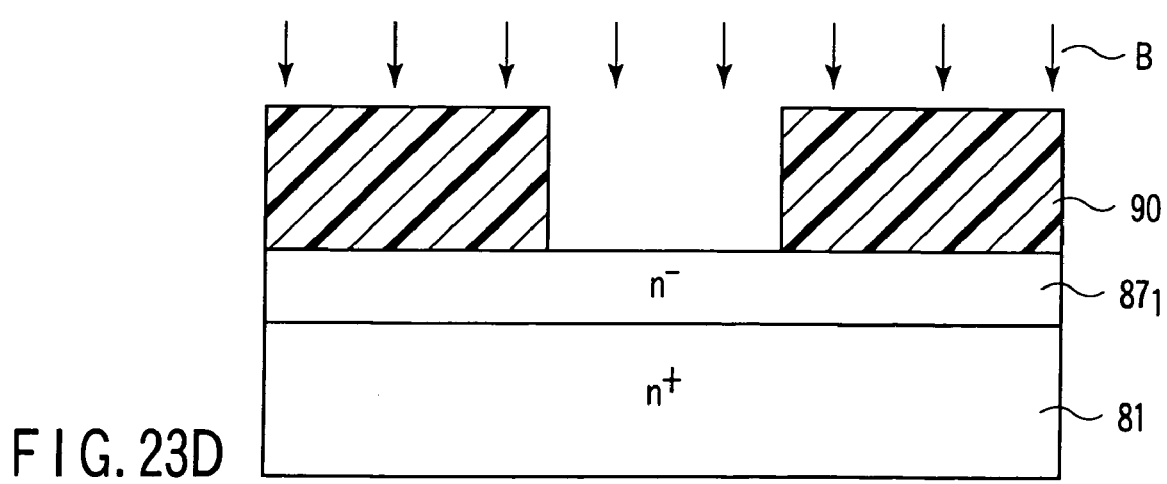

The power MOSFET of this embodiment can be manufactured by adding only 5 steps to the manufacturing method for the conventional planar type power MOSFET shown in FIG. 21. The 5 steps are specifically, a step of forming a deep trench 3, a step of ion-implantation of As and B, a step of activating ion-implanted As and B by annealing, a step of forming an insulating film 6 serving as an element separation insulating film and a step of removing unnecessary portions of the insulating film 6 by CMP.

By contrast, in order to manufacture a planar type power MOSFET having a super junction structure shown in FIG. 21, it is necessary to add 5 or 6 times of an epitaxial growth step, 10 or 12 times of a mask formation step and 10 or 12 times of an ion implantation step to the manufacturing process for the conventional planar power MOSFET shown in FIG. 21.

That is, according to this embodiment, a planar type power MOSFET having substantially the same structure as that of the device shown in FIG. 22 can be manufactured in far less processing steps than that of the conventional case.

The improvement technique and termination structure of the DTMOS unit cell according to this embodiment will now be described. First, the technique of uniformizing the ion implantation amount will now be described.

FIG. 9A is a plan view illustrating the planar pattern of an outermost cell corner portion (a corner portion of an-element region including a plurality of DTMOS unit cells) in the case where the planar pattern of the npn pillar structure formed by the rotation ion implantation method is in stripes. Further, FIG. 9B is a cross sectional view taken along arrows A-A' shown in FIG. 9A, and FIG. 9C is a plan view taken along arrows B-B' shown in FIG. 9A.

From FIGS. 9A to 9C, it can be seen that the width t1 of the n-type pillar layer 5 in the corner portion of the npn structure in stripes is larger than the width t2 of the longitudinal straight portion of the npn pillar structure in stripes.

The difference between the widths t1 and t2 indicates that there is a difference between the total amount of the impurity ion-implanted to the corner portion and that of the impurity ion-implanted to the longitudinal straight portion. The difference in the total amount of the impurity causes a decrease in the reverse directional withstand voltage between the source and drain.

Figure 10A:
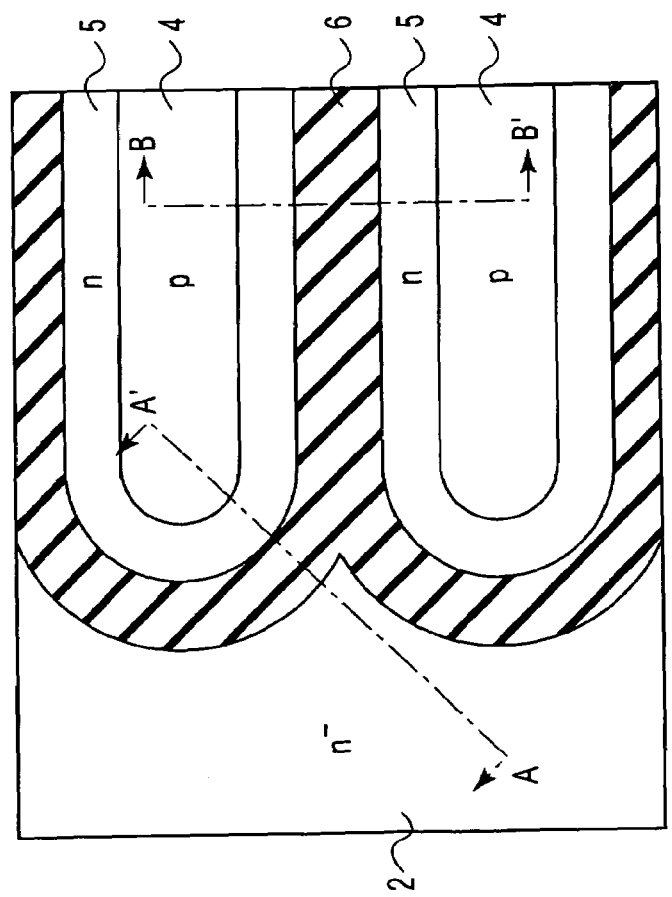
FIGS. 10A to 10C each are a diagram illustrating a solution to the problem of the DTMOS unit cell shown in FIGS. 9A to 9C.
Figure 10B:
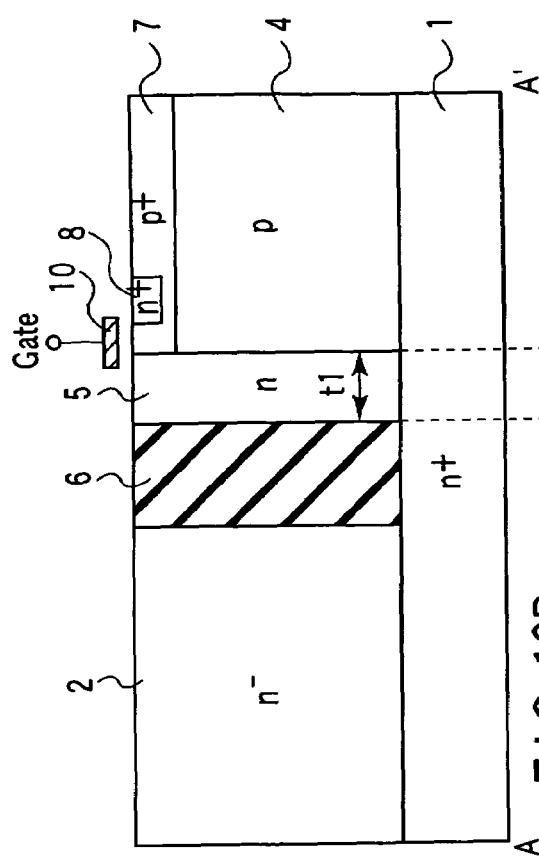
Figure 10C:
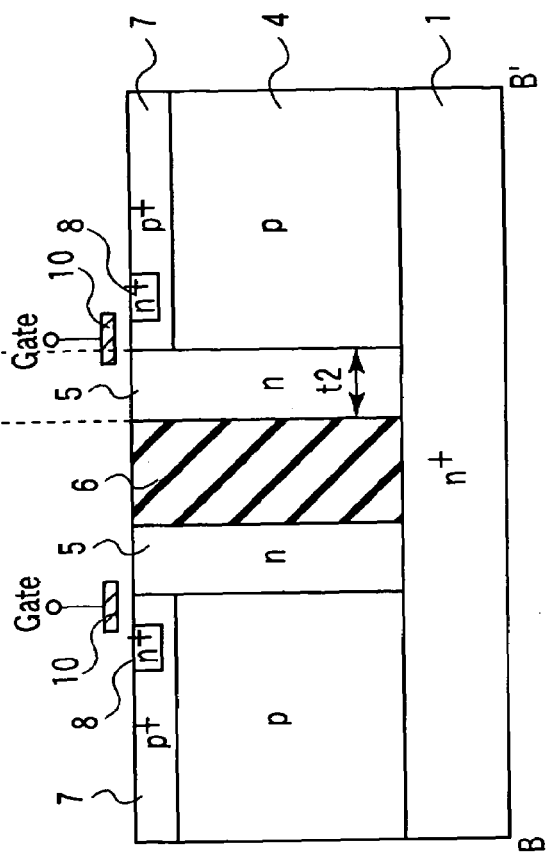

The above-described drawback can be solved by the followings. That is, as shown in FIGS. 10A to 10C, the npn pillar structure of the outermost cell corner portion and the corner portion of the planar pattern of the insulating film 6 that is in contact with the pillar structure is rounded in shape, so as to make t1=t2.

In this manner, the imbalance in terms of the total amount of impurity can be redressed, thereby making it possible to assure a stable drain-source reverse directional withstand voltage. The shape of the npn pillar structure is determined by the shape of the trench 3, and therefore in order to round the shape of the corner portion, it suffices only if the shape of the trench 3 is changed.

In this embodiment, the corner portion is rounded to have a semicircular shape; however it is alternatively possible that it is modified into a polygonal shape. That is, as long as the corner portion is modified into a shape in which there is no 90-degree edge, the imbalance in the total amount of impurity can be remedied. Therefore, the decrease in the drain-source reverse directional withstand voltage can be suppressed.

Figure 11:
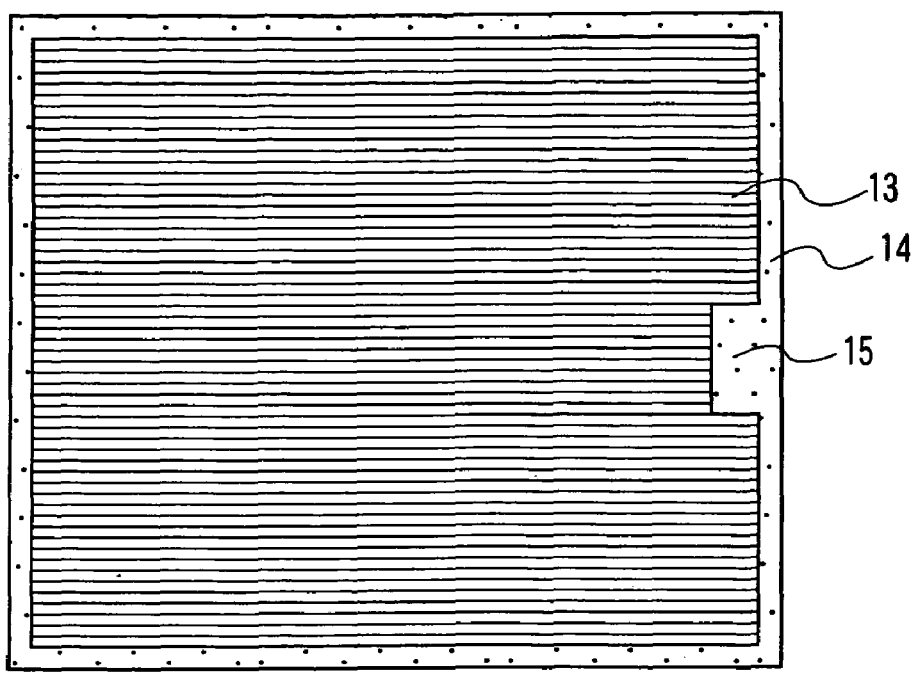
FIG. 11 is a plan view showing a typical example of the gate wiring structure of the DTMOS unit cell according to the first embodiment of the present invention.

FIG. 11 shows a typical example of the gate wiring structure for gate electrodes of a plurality of DTMOS unit cells formed in package. In this figure, reference numeral 13 denotes a MOSFET cell portion consisting of a plurality of DTMOS unit cells (an element region including a plurality of DTMOS unit cells), numeral 14 denotes a gate wiring (the first gate wiring) of the outer region of the chip (peripheral portion of the element region including a plurality of DTMOS unit cell) and numeral 15 denotes a gate pad.

In the case of the gate wiring structure having the above-described configuration, the charge/uncharge of the gate electrode in ON/OFF switching operations is delayed at the central portion (chip central portion) of the MOSFET cell portion 13. Such delay hinders the increase in speed of the switching operation.

Figure 12:
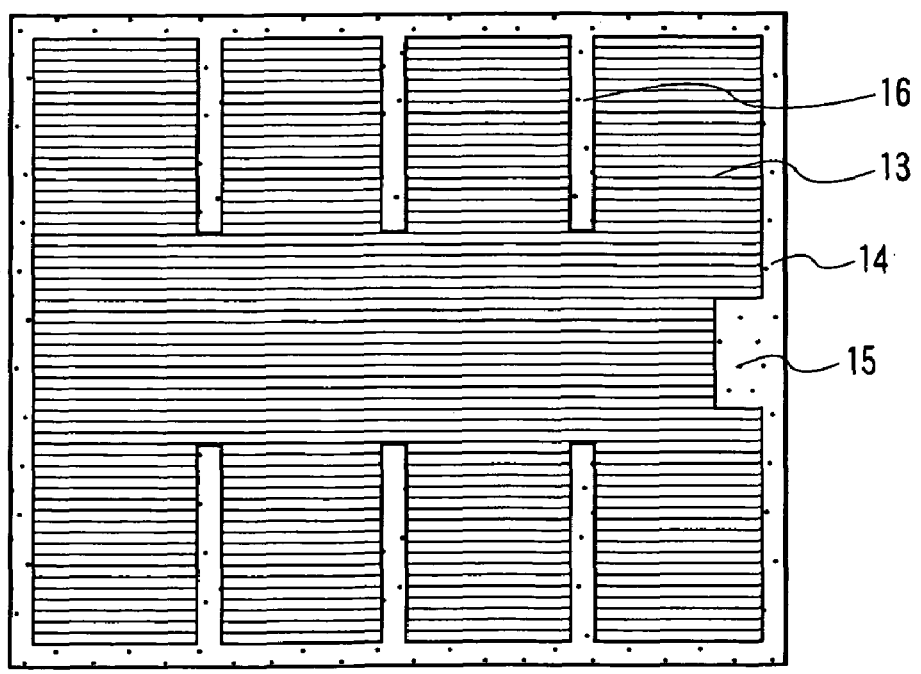
FIG. 12 is a plan view illustrating a solution to the problem that occurs when the gate wiring structure shown in FIG. 11 is employed.

The drawback described above can be solved in the following manner. That is, as shown in FIG. 12, it suffices if a gate wiring (second gate wiring) 16 that extends from the gate wiring 14 to the central portion of the MOSFET cell portion 13 is added. With this arrangement, the gate resistance can be reduced, and the delay at the central portion of the MOSFET cell 13 (the central portion of the chip) can be redressed, thereby making it possible to easily increase the speed of the switching operation.

Further, the gate wiring 16 can be formed by the same step as that of the gate wiring 14, and therefore no additional step is necessary. Therefore, when the gate wiring structure shown in FIG. 12 is employed, the advantage that the DTMOS unit cell can be manufactured at a low cost can be assured as it is so with the conventional case.

Figure 13:
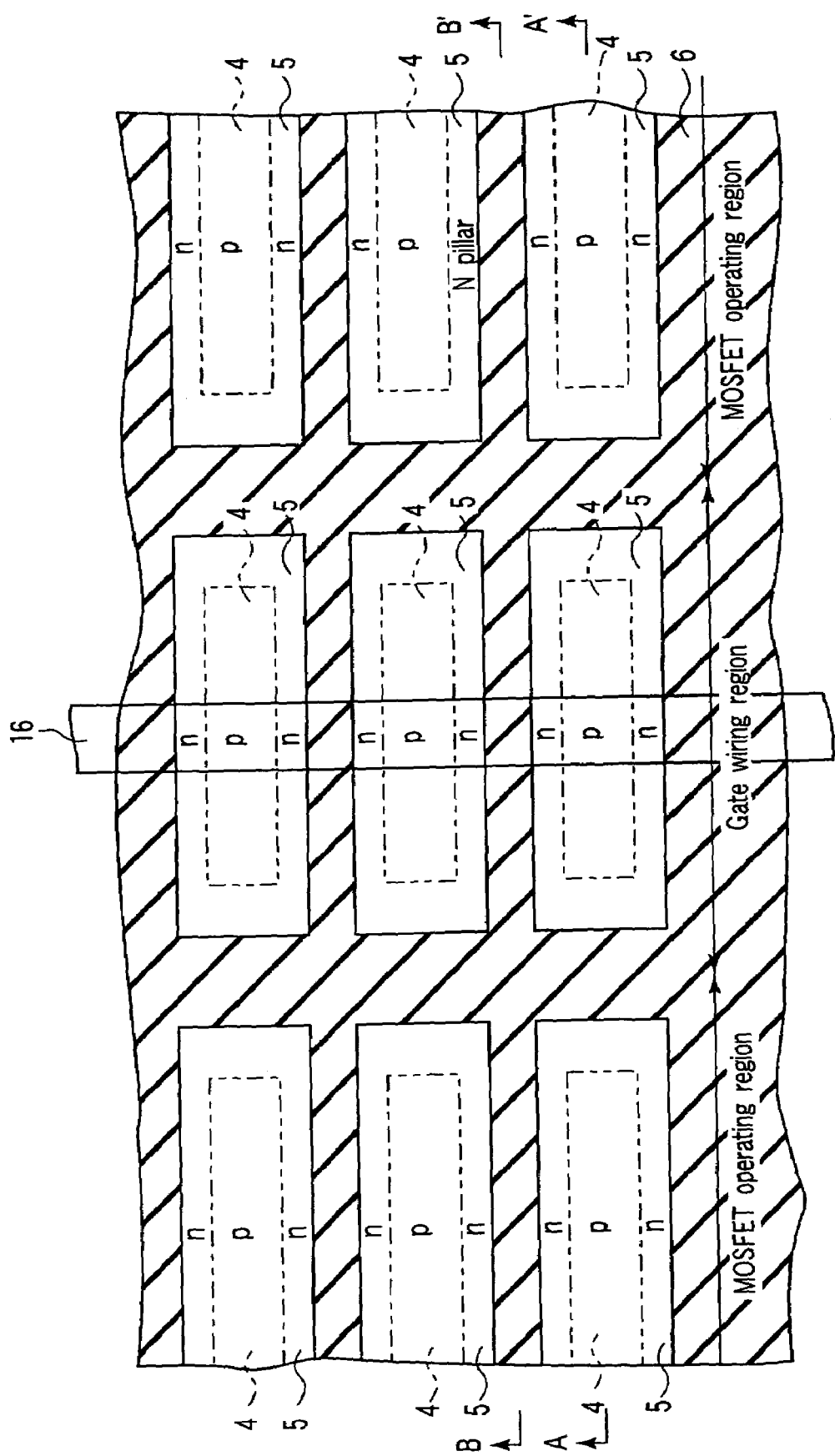
FIG. 13 is a plan view illustrating an underlying structure of the gate wiring structure of the DTMOS unit cell shown in FIG. 12.
Figure 14:
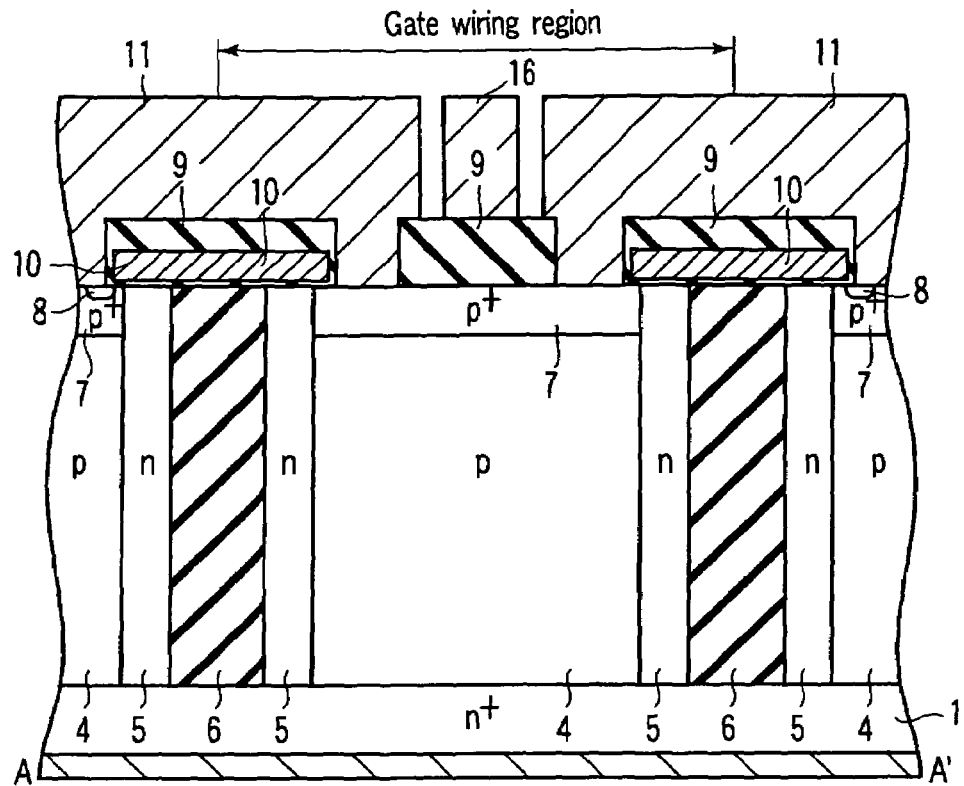
FIG. 14 is a cross sectional view taken along arrows A-A' in FIG. 13.
Figure 15:
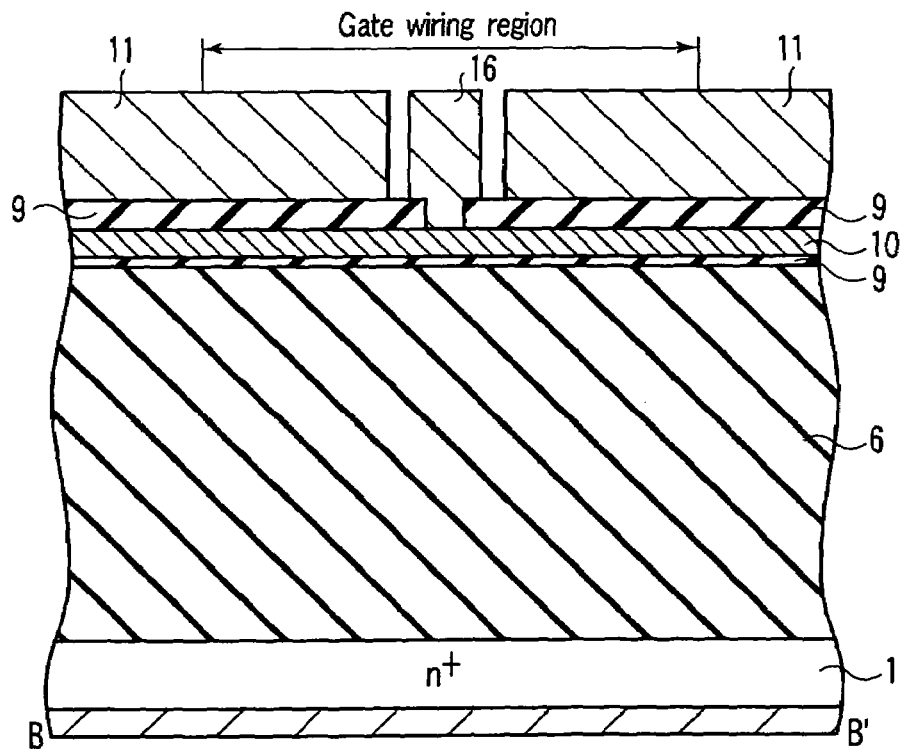
FIG. 15 is a cross sectional view taken along arrows B-B' in FIG. 13.

FIG. 13 shows an underlying structure of the gate wiring structure. FIG. 14 is a cross sectional view taken along arrows A-A' in FIG. 13, and FIG. 15 is a cross sectional view taken along arrows B-B' in FIG. 13. The element region underneath the gate wiring 16 (gate wiring region) and the element region in which a plurality of DTMOS unit cells that carry out MOSFET operations (MOSFET region) are physically separated from each other by the insulating film 6. In the gate wiring region, the npn pillar structure is formed in a similar manner to that of the MOSFET region.

The $p^+$-type base layer 7 of the MOSFET region and the $p^+$-type base layer 7 of the gate wiring region are electrically connected to each other via the source electrode 11. However, the $n^+$-type source diffusion layer 8 is not formed in the $p^+$-type base layer 7 of the gate wiring region, and therefore the MOSFET operation does not occur in the gate wiring region.

FIG. 25 shows the termination structure of the DTMOS unit cell according to the first embodiment of the present invention. The termination structure can be formed at the same time when the DTMOS unit cell is formed. More specifically, it can be formed in the following manner. In the step of making the trench 3 illustrated in FIG. 2, a trench having a width of 10 to 30 μm is formed in the termination region of the $n^-$-type epitaxial Si layer 2 at the same time. In the step of forming the insulating film 6 illustrated in FIG. 5, the trench made in the termination region is filled with the insulating film 6 at the same time. In the CMP step illustrated in FIG. 6, the surface of the termination region is planarized, and the unnecessary portion of the insulating film 6 on the trench of the termination region is removed.

In the case of 600V class, the required length of the termination structure shown in FIG. 24 is about 200 to 600 μm, whereas the required length of the termination structure according to the first embodiment of the present invention is small as about 100 to 20 μm, which is about ¼ of the former case. This is because, conventionally, the electrical field is relaxed with use of the n-type epitaxial Si layer 89, whereas in this embodiment, the electrical field is relaxed by the insulating film 6 formed in the termination region.

As described above, according to this embodiment, there will be no substantial wasteful portion of the termination region, thereby increasing the yield of chips produced from a Si wafer. Consequently, the production cost can be reduced.

Figure 16:
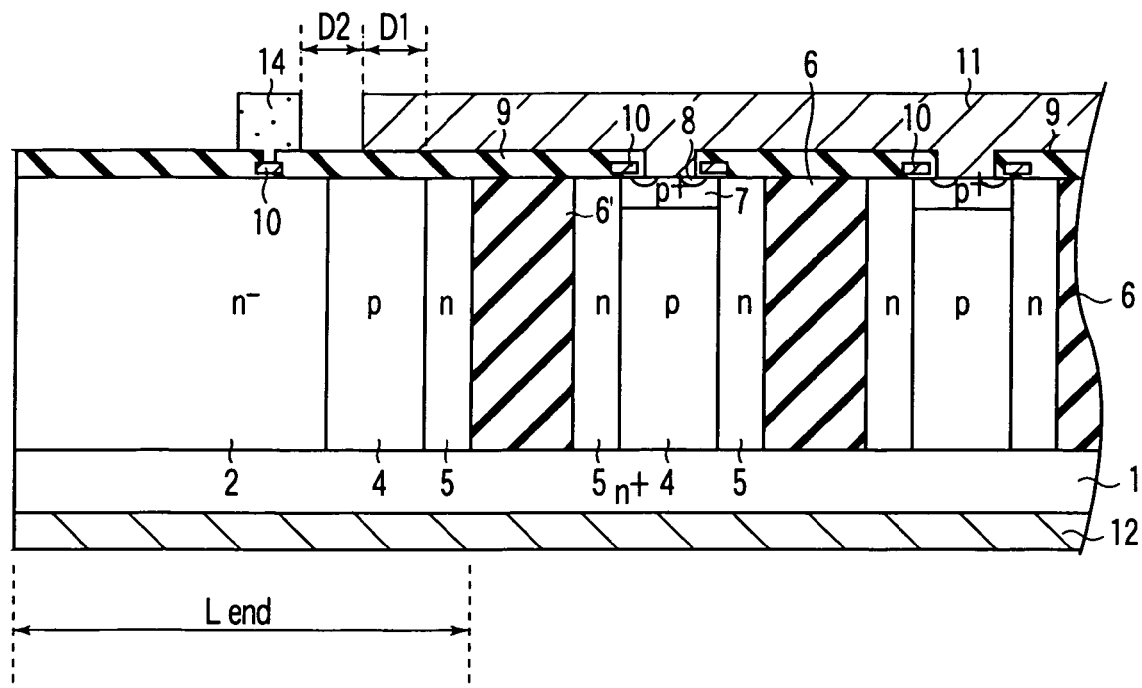
FIG. 16 is a diagram showing the termination structure of the DTMOS unit cell according to the first embodiment of the present invention.

FIG. 16 illustrates another termination structure according to the first embodiment of the present invention.

On an outer side (the termination region side) of an insulating film 6' that separates the DTMOS unit cell located on the outermost section of the FET operation region and the termination region from each other, n-type pillar layers 5 and a p-type pillar layer 4 which are similar to those of the FET operation region are inevitably formed. The insulating film 6' is formed in the step as that of the insulating film 6.

Here, it should be noted that on the surface of the n-type pillar layer 5 (substrate surface), the same potential as the drain potential on the rear surface of the substrate appears when applying a drain-source reverse directional voltage. Therefore, the source electrode 11 is located on the inter-layer insulating film 9 which can withstand the applied voltage. The source electrode 11 is formed to be in contact with the source diffusion layer 8 of each of the DTMOS unit cells of the FET operation region.

Further, in order to obtain a drain-source reverse directional withstand voltage of, for example, 600V, a distance D1 between the end portion on the termination region side of the source electrode 11 and the end portion on the terminal region side of the n-type pillar layer 5, which has a high potential, (that is, the boundary between the p-type pillar layer 4 and the n-type pillar layer 5) is set to 10 μm. The reason for setting the distance D1 to 10 μm is that it has been found that a necessary withstand voltage can be obtained with a condition of $D1 \geq 2$ μm or more, as indicated in FIG. 26.

With the above-described structure, the electrical field applied to the end of the source electrode 11 can be sufficiently relaxed, and therefore a stable drain-source reverse directional withstand voltage can be secured. It should be noted here that the distance D1 is at least 10 μm; however it is preferable that the distance D1 should not be excessively long in consideration of the reduction in size. More specifically, it is, preferably, 15 μm or less.

Then, the gate wiring structure, which will now be described, is formed on the termination region. The gate wiring structure consists of the gate electrode 10 and the gate wiring 14 (the gate wiring 16 described before as a preferable example), and the distance D2 between the gate electrode 10 and the gate wiring 14 is set to about 5 μm.

By employing the above-described gate wiring structure, it suffices if the measure Lend of the termination region is set about 155 μm in order to assure, for example, 600V of a drain-source reverse directional withstand voltage. This value is only about ¼ of the measurement of the termination region of the conventional planar type insulated gate field effect transistor. In other words, the measure Lend of the termination region can be remarkably reduced by providing a simple gate wiring structure in the termination region.

The above-described technical features for improving the DTMOS unit cell (more specifically, the technique for rendering the implantation amount uniform and delay inhibiting technique) and the termination structure can be combined appropriately. Further, they can be applied as well in a similar manner to the second to fourth embodiments that will now be described.

Second Embodiment

Figure 17:
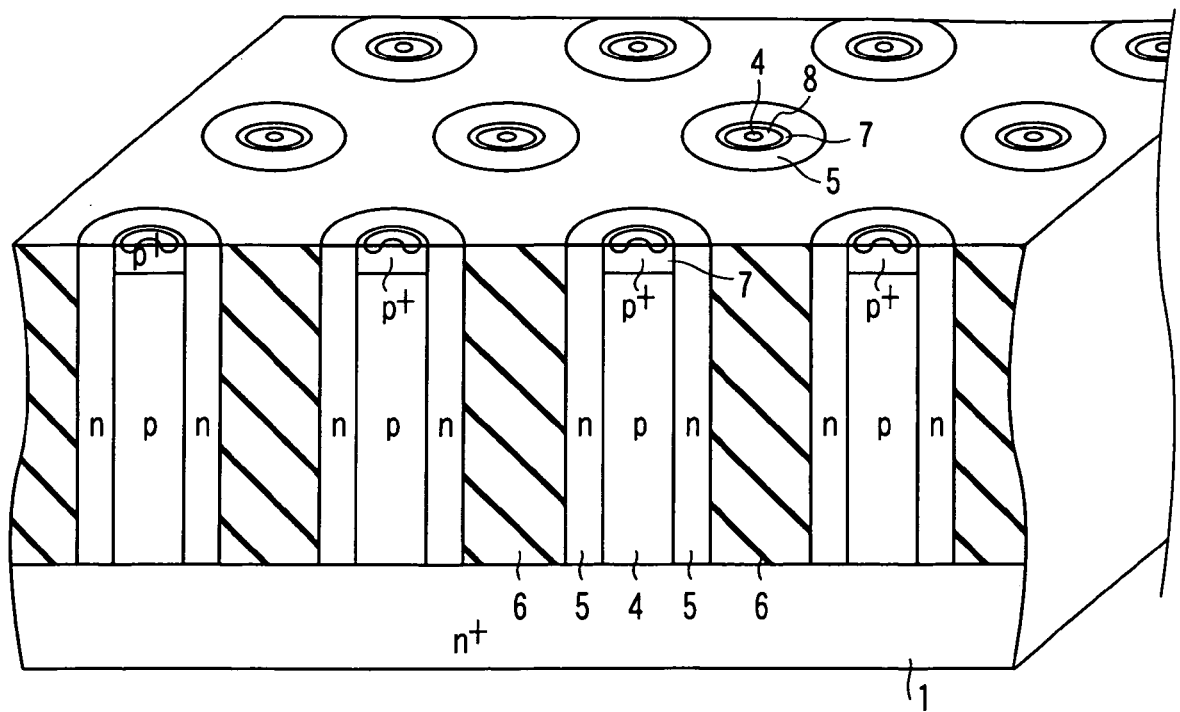
FIG. 17 is a perspective and cross sectional view illustrating a power MOSFET according to the second embodiment of the present invention.

FIG. 17 is a perspective and cross sectional view illustrating a power MOSFET according to the second embodiment of the present invention. It should be noted that the parts of this embodiment that correspond to those shown in FIGS. 1 to 16 will be designated by the same reference numerals, and the detailed descriptions therefor will not be repeated. (This is also the case for the embodiments from the third one on.)

The point of this embodiment that is different from that of the first embodiment is that the pattern of the npn pillar structure taken from above (that is, a planar pattern) is made into a so-called offset mesh-like pattern. With this structure, the channel density can be increased in some cases depending on the measurements of the element. It is alternatively possible to make the pattern of the npn pillar structure taken from above (that is, a planar pattern) into a so-called mesh-like pattern (, which is a pattern in which two npn pillar structure arranged in up and down direction are not displaced with respect to each other in a lateral direction).

Third Embodiment

Figure 18:
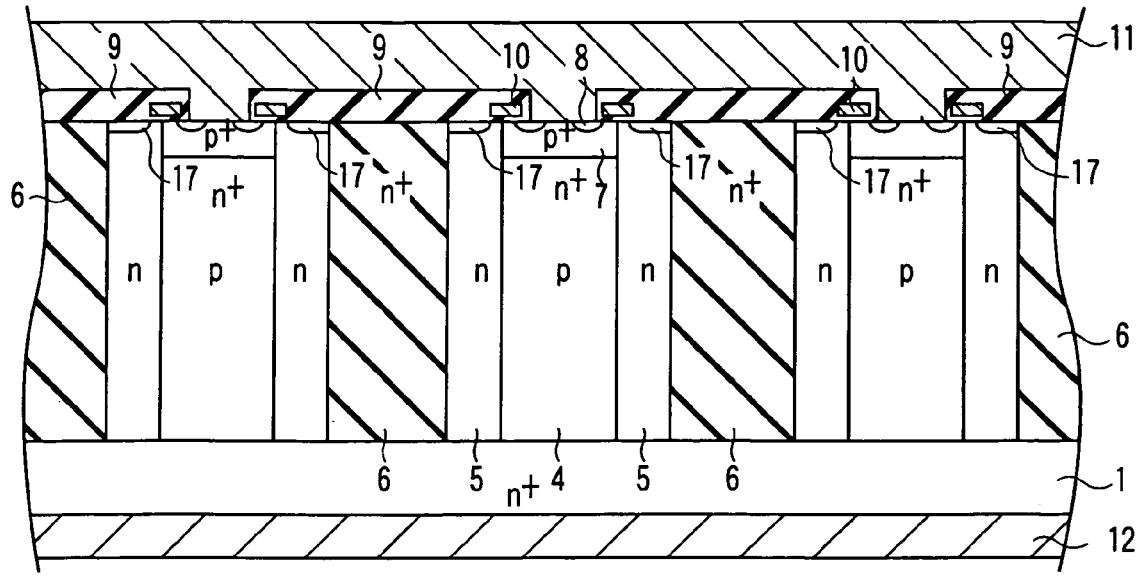
FIG. 18 is a cross sectional view illustrating a power MOSFET according to the third embodiment of the present invention.

FIG. 18 is a cross sectional view illustrating a power MOSFET according to the third embodiment of the present invention.

The point of this embodiment that is different from the first embodiment is that an $n^+$-type diffusion layer 17 that has a high impurity concentration is formed on the surface of the n-type pillar layer 5.

In the case where there is no $n^+$-type diffusion layer 17, a depletion layer is expanded on the surface of the n-type pillar layer 5 when a voltage is applied between the source and drain. Therefore, if a charge of Na ion or the like is attached to the surface of the n-type pillar layer 5, the depletion is partially inhibited. Then, the electrical field is concentrated to the portion where the depletion is inhibited, thereby possibly causing a breakdown.

By contrast, in this embodiment, the $n^+$-type diffusion layer 17 is formed on the surface of the n-type pillar layer 5. With this structure, the expansion of the depletion layer on the surface of the n-type pillar layer 5 can be prevented, thereby making it possible to avoid the above-described drawback. Further, the $n^+$-type diffusion layer 17 can be formed at the same time as that of the $n^+$-type source diffusion layer 8, which is formed by ion implantation and annealing, and therefore the number of steps is not increased. As described above, the $n^+$-type diffusion layer 17 and the $n^+$-type source diffusion layer 8 are formed by the same ion implantation and annealing, and therefore the their impurity concentrations are substantially the same.

Fourth Embodiment

Figure 19:
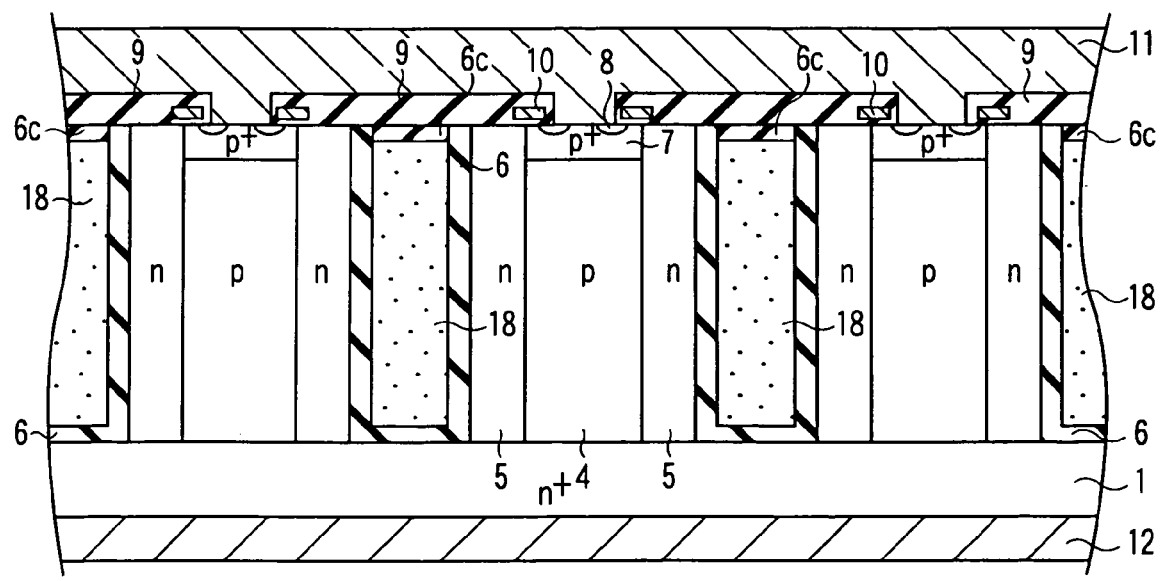
FIG. 19 is a cross sectional view illustrating a power MOSFET according to the fourth embodiment of the present invention.

FIG. 19 is a cross sectional view illustrating a power MOSFET according to the fourth embodiment of the present invention.

The point of this embodiment that is different from the first embodiment is that the deep trench 3 is filled with not only the insulating film 6, but also with the polysilicon layer 18 together with it.

In more detail, the insulating film 6 (the first insulating film) made of, for example, an $SiO_2$ film having a thickness of about 1 to 2 μm is formed by a deposition or thermal oxidation method on the bottom surface and side surfaces of the trench 3 having a width of about 8 μm. Then, the polysilicon layer 18 is deposited on the entire surface. After that, the unnecessary portion of the polysilicon layer 18, which is located outside the trench 3, is removed by CMP or etching. At the same time, the portion of the polysilicon layer 18, which is located underneath the opening surface of the trench 3, is removed. Next, the not-yet filled portion underneath the opening surface of the trench 3 is filled with an insulating film (cap insulating film) 6c (the third insulating film), and the upper surface of the polysilicon layer 18 is thus capped. The insulating films 6 and 6c serve to cover the bottom surface, side surfaces and the upper surface of the polyslicon layer 18 formed on the $n^+$-type Si substrate 1.

In order to form the polysilicon layer 18 in the trench 3 with priority, a silicon oxide film (the second insulating film), which is not shown in the figure, may be formed on the surface of the $n^+$-type epitaxial Si layer 2. Then, the trench 3 may be opened up, and the bottom surface and side surfaces of the trench 3 should be covered with a silicon nitride film (the first insulating film). After that, the polysilicon layer 18 may be grown by the CVD method.

Since the polysilicon layer 18 is not a current path, it need not be completely embedded. For this reason, the polysilicon layer 18 can be formed more quickly than the insulating film 6. It can be formed at a film forming speed of, for example, about 1 μm/min.

Since Si is grown from both sides of the trench 3, the film forming speed the trench 3 having a width of 5 μm can be filled in 2.5 minutes in the case of the above-mentioned film forming speed. Thus, according to this embodiment, the deep trench 3 can be filled in a short period of time, and therefore the processing time can be shortened.

Further, the polysilicon layer 18 has a thermal expansion coefficient equal to that of the n-type pillar layer 5 and the p-type pillar layer 4. Therefore, as compared to the case where the entire trench 3 is filled only with the insulating film, a large thermal stress is not applied to the Si portion located underneath the trench 3 if it undergoes a heat process after separation of elements. In this manner, it is possible to prevent a crystal defect from occurring in the Si portion, which causes such a drawback as increasing the leak current.

Furthermore, according to this embodiment, a voltage can be shared by the insulating film 6c on the upper surface of the polysilicon layer 18 and the insulating film 6 on the lower surface of the polysilicon layer 18. Therefore, the withstand voltage can be raised as compared to the case where the trench 3 is filled with the insulating layer 6 and the polysilicon layer 18.

Figure 20:
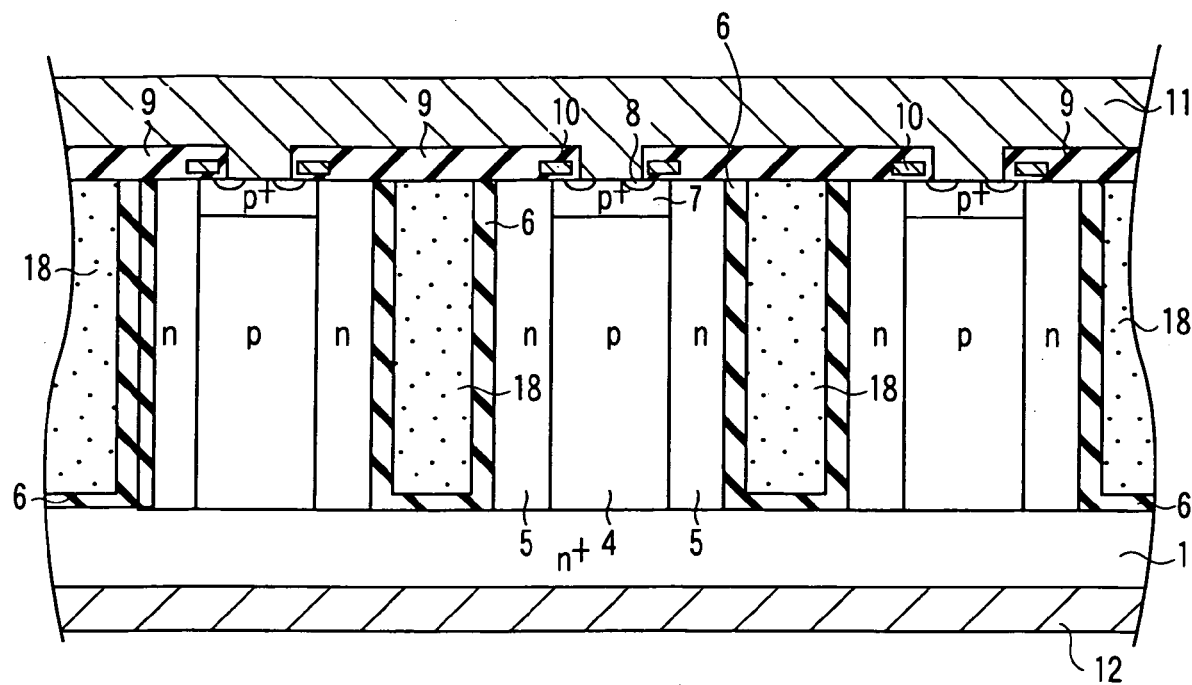
FIG. 20 is a cross sectional view illustrating a modified version of the fourth embodiment of the present invention.

It should be noted here that the insulating film 6c is not essential to this embodiment. FIG. 20 shows an element structure that does not include the insulating film 6c. In this case, it is not necessary to remove the polysilicon layer 18 located underneath the opening surface of the trench 3.

When the concentration of the n-type impurity in the n-type pillar layer 5 is set to $12\times10^{15}$ (atoms/cm$^3$) at peak and the concentration of the p-type impurity in the p-type pillar layer 4 is set to $4\times10^{15}$ (atoms/cm$^3$) at peak, this element structure was compared with the conventional planar type shown in FIG. 21 for the same withstand voltage (Vdss=720 (V)) in terms of ON resistance. With the result, it was confirmed that the ON resistance could be reduced to about 24% (Ron=0.36 ($\Omega$)) of that of the conventional type.

The concentrations of these impurities are not limited to these values provided above, but it has been confirmed that, for example, the concentration of the n-type impurity in the n-type pillar layer 5 may be about 3 to $18\times10^{15}$ (atoms/cm$^3$) and the concentration of the p-type impurity in the p-type pillar layer 4 may be about 0.2 to $8\times10^{15}$ (atoms/cm$^3$) to obtain a similar effect to the above. Further, it suffices if the concentration of the n-type impurity in the n$^-$-type epitaxial Si layer 2 is about $5\times10^{13}$ to $3\times10^{14}$ (atoms/cm$^3$).

Note that the gate electrode 10 in FIGS. 16, 18, 19, 20, and 25 may continuously extend over the insulating film 6 and two n-type pillar layers 5 as in FIG. 7.

It should be noted that the present invention is not limited to those of the embodiments described above, but it is alternatively possible that, for example, the channel is of the p-type in place of the n-type. Further, it is possible that the power MOS transistor and some other circuits including the control circuit and protection circuit are formed within the same chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first conductivity type semiconductor substrate;
a vertical unit cell that employs the first conductivity type semiconductor substrate as a first conductivity type drain layer; and
a separating member formed on the first conductivity type semiconductor substrate, separating the unit cell from other element,
the unit cell comprising:
a semiconductor structure comprising three semiconductor layers selectively formed on a main surface of the first conductivity type semiconductor substrate, the three semiconductor layers including a second conductivity type semiconductor layer and two first conductivity type semiconductor layers formed to interpose the second conductivity type semiconductor layer from both side surfaces, a pn junction boundary between the second conductivity type semiconductor layer and each of the first conductivity type semiconductor layers being substantially vertical to the main surface of the first conductivity type semiconductor substrate,
a second conductivity type base layer formed on an upper surface of the second conductivity type semiconductor layer and having an impurity concentration higher than the second conductivity type semiconductor layer;
a first conductivity type source diffusion layer selectively formed on a surface of the second conductivity type base layer;
a gate insulating film formed on the second conductivity type base layer interposed between the first conductivity type source diffusion layer and one of the first conductivity type semiconductor layers, and
a gate electrode formed on the gate insulating film,
wherein a plurality of unit cells identical to the unit cell are formed such as to employ the first conductivity type semiconductor substrate as a common first conductivity type drain layer, and
a termination structure is provided in which another first conductivity type and another second conductivity type semiconductor layers are formed on a terminal portion of the first conductivity type semiconductor substrate wherein the termination structure is connected to a unit cell that is closest to the terminal portion via an insulating film formed on the first conductivity type semiconductor substrate.

2. The semiconductor device according to claim 1, wherein a concentration of a first conductivity type impurity in each of the first conductivity type semiconductor layers is 3 to $18\times10^{15}$ (atoms/cm$^3$) and a concentration of a second conductivity type impurity in the second conductivity type semiconductor layer is 0.2 to $8\times10^{15}$ (atoms/cm$^3$).

3. The semiconductor device according to claim 1, wherein a first conductivity type impurity in each of the first conductivity type semiconductor layers is arsenic and a second conductivity type impurity in the second conductivity type semiconductor layer is boron.

4. The semiconductor device according to claim 1, wherein an inequality: $100\times|A-B|/A \leq 5$ is satisfied where A represents a total amount of a second conductivity type impurity in the second conductivity type semiconductor layer and B represents a total amount of a first conductivity type impurity in the two first conductivity type semiconductor layers.

5. The semiconductor device according to claim 1, wherein a first conductivity type diffusion layer having an impurity concentration higher than each the first conductivity type semiconductor layers is formed on an upper surface of each of the first conductivity type semiconductor layers.

6. The semiconductor device according to claim 5, wherein the impurity concentration of the first conductivity type impurity in the first conductivity type diffusion layer is substantially the same as a first conductivity type impurity concentration in the first conductivity type source diffusion layer.

7. The semiconductor device according to claim 1, wherein the separating member includes a semiconductor layer formed above the first conductivity type semiconductor substrate, and an insulating film formed to cover a bottom surface, side surfaces and an upper surface of the semiconductor layer.

8. The semiconductor device according to claim 1, wherein the separating member includes a semiconductor layer formed above the first conductivity type semiconductor substrate, and an insulating film formed to cover a bottom surface and side surfaces of the semiconductor layer.

9. The semiconductor device according to claim 1, wherein a corner portion of an element region containing the unit cells is formed into a round or polygonal shape.

10. The semiconductor device according to claim 9, wherein a corner portion of the separating member located adjacent to the element region is formed into a round or polygonal shape.

11. The semiconductor device according to claim 1, wherein
a first gate wiring for the gate electrodes of the unit cells are provided in a peripheral portion of an element region that contains the unit cells, and a second gate wiring for the gate electrodes of the unit cells, which extend from the peripheral portion of the element region towards an inside of the element region, are connected to the first gate wiring.

12. The semiconductor device according to claim 11, wherein the unit cells are absent in the element region located underneath the second gate wiring.

13. The semiconductor device according to claim 12, wherein a second semiconductor structure that is identical to the semiconductor structure and is physically separated from the unit cell by the separating member, is formed in the element region located underneath the second gate wiring.

14. The semiconductor device according to claim 1, wherein
a termination region for the element region that contains the unit cells is separated from an element region by the separating member,
one of the first conductivity type semiconductor layers and the second conductivity type semiconductor layer are further formed in line on a side surface of the separating member on the termination region side;
a source electrode is formed such as to be in contact with each of the first conductivity type source diffusion layers of the unit cells; and
a distance between an end portion of the source electrode on the termination region side and an end portion on the termination region side of the first conductivity type semiconductor layer further formed on the side surface of the separating member on the termination region side is set to 10 μm or more.

15. The semiconductor device according to claim 14, wherein a gate wiring structure is formed on the termination region.

* * * * *